United States Patent
Yun et al.

(10) Patent No.: US 10,501,655 B2
(45) Date of Patent: Dec. 10, 2019

(54) ORGANIC FILM FORMING COMPOSITION AND ELECTRONIC APPARATUS COMPRISING A CURED PRODUCT THEREOF

(71) Applicant: SAMSUNG DISPLAY CO., LTD., Yongin-si, Gyeonggi-do (KR)

(72) Inventors: Wonmin Yun, Yongin-si (KR); Eungseok Park, Yongin-si (KR); Byoungduk Lee, Yongin-si (KR); Yunah Chung, Yongin-si (KR); Yoonhyeung Cho, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 210 days.

(21) Appl. No.: 15/183,553

(22) Filed: Jun. 15, 2016

(65) Prior Publication Data

US 2017/0145249 A1    May 25, 2017

(30) Foreign Application Priority Data

Nov. 25, 2015    (KR) .................. 10-2015-0165567

(51) Int. Cl.
*C09D 135/02*    (2006.01)
*C08F 222/14*    (2006.01)
(Continued)

(52) U.S. Cl.
CPC .......... *C09D 135/02* (2013.01); *C08F 222/14* (2013.01); *H01L 23/293* (2013.01);
(Continued)

(58) Field of Classification Search
CPC ................................................ C09D 135/02
See application file for complete search history.

(56) References Cited

U.S. PATENT DOCUMENTS 5,595,821 A * 1/1997 Hager ............... B29C 67/24
                                                          428/402
2009/0045729 A1    2/2009 Fujita et al.
(Continued)

FOREIGN PATENT DOCUMENTS

KR    20070031776 A  *  3/2007
KR    10-2008-0091368 A    10/2008
(Continued)

*Primary Examiner* — Michael F Pepitone
(74) *Attorney, Agent, or Firm* — Lewis Roca Rothgerber Christie LLP

(57) ABSTRACT

An organic film forming composition having improved hygroscopic properties (e.g., moisture-adsorbing abilities) and an electronic apparatus including a cured product of the organic film forming composition. The organic film forming composition may include a metal (meth)acrylate represented by Formula 1; and a curable material having at least two curable groups selected from the groups represented by Formulae 2A to 2D:

Formula 1

Formula 2A (Continued)

-continued

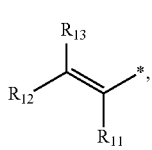

Formula 2B

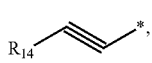

Formula 2C

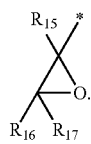

Formula 2D

14 Claims, 5 Drawing Sheets

(51) Int. Cl.
*H01L 23/29* (2006.01)
*H01L 23/31* (2006.01)
*H01L 51/00* (2006.01)
H01L 33/56 (2010.01)
H01L 51/10 (2006.01)
H01L 51/44 (2006.01)
H01L 51/52 (2006.01)

(52) U.S. Cl.
CPC ...... *H01L 23/3135* (2013.01); *H01L 51/0034* (2013.01); *C08F 2222/145* (2013.01); *C08F 2500/26* (2013.01); *C08F 2800/20* (2013.01); *H01L 33/56* (2013.01); *H01L 51/107* (2013.01); *H01L 51/448* (2013.01); *H01L 51/5237* (2013.01)

(56) References Cited

U.S. PATENT DOCUMENTS

| | | |
|---|---|---|
| 2009/0261717 A1 | 10/2009 | Buesing et al. |
| 2010/0001634 A1 | 1/2010 | Fujita et al. |
| 2015/0014646 A1* | 1/2015 | Kaplan ............... H01L 51/5253 257/40 |
| 2015/0299523 A1 | 10/2015 | Park et al. |
| 2015/0337065 A1 | 11/2015 | Nam et al. |
| 2015/0353668 A1 | 12/2015 | Woo et al. |

FOREIGN PATENT DOCUMENTS

| | | |
|---|---|---|
| KR | 10-2008-0109000 A | 12/2008 |
| KR | 10-2009-0055560 A | 6/2009 |
| KR | 10-2011-0001884 A | 1/2011 |
| KR | 10-2014-0088474 A | 7/2014 |
| KR | 10-2014-0091413 A | 7/2014 |
| KR | 10-2014-0091414 A | 7/2014 |
| KR | 10-2014-0115883 A | 10/2014 |
| KR | 10-2015-0016922 A | 2/2015 |

* cited by examiner

ORGANIC FILM FORMING COMPOSITION AND ELECTRONIC APPARATUS COMPRISING A CURED PRODUCT THEREOF

CROSS-REFERENCE TO RELATED APPLICATION

This application claims priority to and the benefit of Korean Patent Application No. 10-2015-0165567, filed on Nov. 25, 2015, in the Korean Intellectual Property Office, the entire content of which is incorporated herein by reference.

BACKGROUND

1. Field

One or more aspects of example embodiments of the present disclosure are related to an organic film forming composition, and an electronic apparatus including a cured product of the organic film forming composition.

2. Description of the Related Art

Electronic devices (such as organic light-emitting devices (OLEDs), liquid crystal displays (LCDs), light-emitting diode (LEDs), organic photovoltaic (OPV) cells, and organic thin film transistors) are vulnerable to oxygen and/or moisture, and are highly likely to be deteriorated by the above.

Therefore, to implement high-quality electronic apparatuses, there is a need for an effective seal for electronic devices.

SUMMARY

One or more aspects of example embodiments of the present disclosure are directed toward an organic film forming composition having improved hygroscopic properties (e.g., moisture-adsorbing abilities), and an electronic apparatus including a cured product of the organic film forming composition.

Additional aspects will be set forth in part in the description which follows and, in part, will be apparent from the description, or may be learned by practice of the presented embodiments.

One or more example embodiments of the present disclosure provide an organic film forming composition including a metal (meth)acrylate represented by Formula 1; and a curable material:

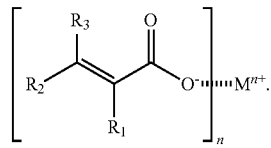

Formula 1

In Formula 1,

M may be a metal atom;

n may be an integer selected from 1 to 3;

$R_1$ to $R_3$ may each independently be selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group; and ⁞⁞⁞⁞⁞ may represent an interaction (e.g., an interparticle force or attraction) between adjacent ions.

For example, in Formula 1, M may be selected from lithium (Li), sodium (Na), calcium (Ca), zinc (Zn), magnesium (Mg), and aluminum (Al).

The metal (meth)acrylate may be represented by at least one selected from Formulae 1A to 1C:

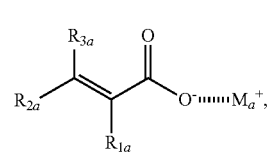

Formula 1A

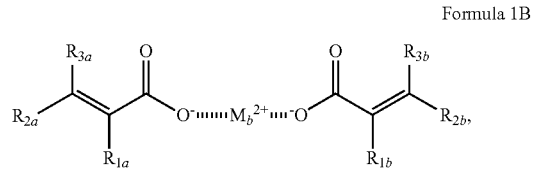

Formula 1B

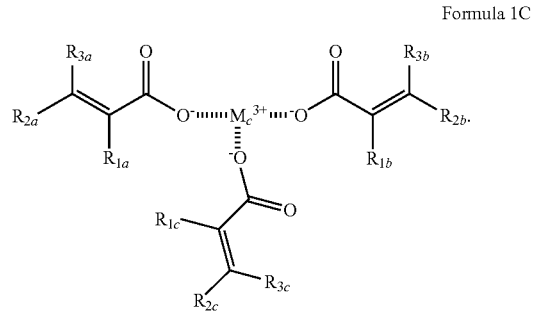

Formula 1C

In Formulae 1A to 1C, $M_a$ may be a monovalent metal, $M_b$ may be a divalent metal, $M_c$ may be a trivalent metal, $R_{1a}$ to $R_{1c}$ may each independently be the same as described herein in connection with $R_1$, $R_{2a}$ to $R_{2c}$ may each independently be the same as described herein in connection with $R_2$, and $R_{3a}$ to $R_{3c}$ may each independently be the same as described herein in connection with $R_3$.

The curable material may have at least two selected from the curable groups represented by Formulae 2A to 2D:

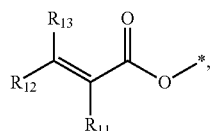

Formula 2A

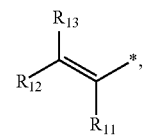

Formula 2B

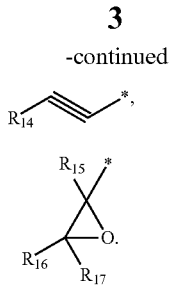

In Formulae 2A to 2D, $R_{11}$ may be the same as described herein in connection with $R_1$;

$R_{12}$ may be the same as described herein in connection with $R_2$;

$R_{13}$ may be the same as described herein in connection with $R_3$;

$R_{14}$ to $R_{17}$ may each independently be selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group; and

* may be a binding site to a backbone of the curable material.

For example, the curable material may be represented by Formula 3:

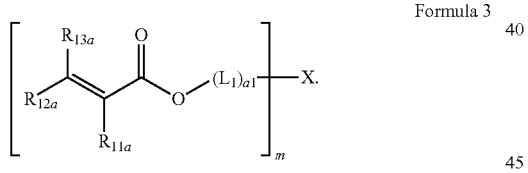

In Formula 3, $R_{11a}$ may be the same as described herein in connection with $R_1$;

$R_{12a}$ may be the same as described herein in connection with $R_2$;

$R_{13a}$ may be the same as described herein in connection with $R_3$;

X may be selected from the group consisting of: a $C_1$-$C_{30}$ hydrocarbon group; and a $C_1$-$C_{30}$ hydrocarbon group substituted with at least one selected from deuterium, —F, —Cl, —Br, —I, a hydroxyl group, a cyano group, a nitro group, an amino group, an amidino group, a hydrazino group, a hydrazono group, and a $C_1$-$C_{10}$ alkyl group;

$L_1$ may be selected from *—$CH_2$—O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

a1 may be an integer selected from 0 to 2;

m may be an integer of 2 or greater; and

* and *' may each independently be a binding site to an adjacent atom.

For example, the curable material may be represented by at least one selected from Formulae 3A to 3C:

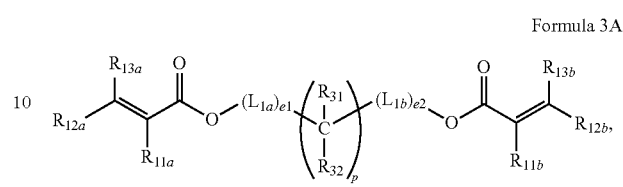

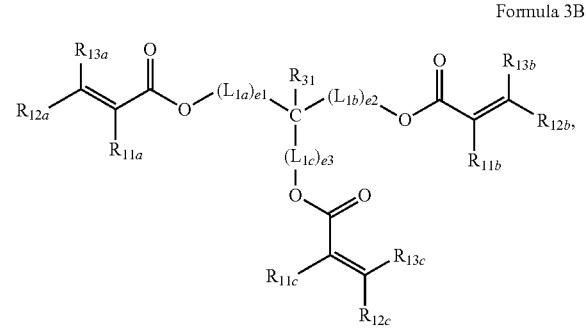

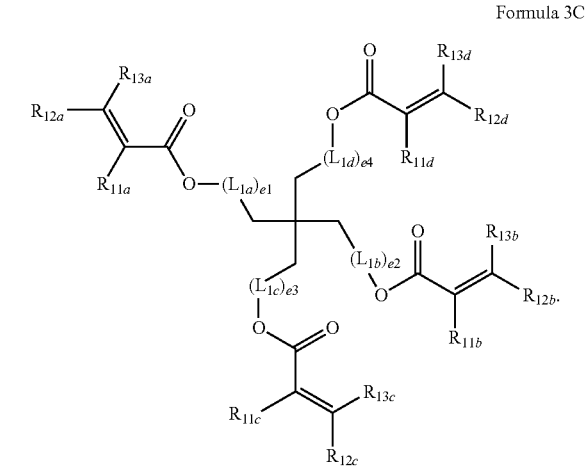

In Formulae 3A to 3C, $L_{1a}$ to $L_{1d}$ may each independently be selected from *—$CH_2$—O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

e1 to e4 may each independently be an integer selected from 0 to 2;

$R_{11a}$ to $R_{11d}$ may each independently be the same as described herein in connection with $R_1$;

$R_{12a}$ to $R_{12d}$ may each independently be the same as described herein in connection with $R_2$;

$R_{13a}$ to $R_{13d}$ may each independently be the same as described herein in connection with $R_3$;

$R_{31}$ and $R_{32}$ may each independently be selected from the group consisting of:

hydrogen, deuterium, —F, —Cl, —Br, —I, a hydroxyl group, a cyano group, a nitro group, an amino group, an amidino group, a hydrazino group, a hydrazono group;

a $C_1$-$C_{10}$ alkyl group, and a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group; and p may be an integer selected from 1 to 30, wherein *—C($R_{31}$)($R_{32}$)—*'(s) may be the same as or different from each other when p is 2 or greater.

The curable material may be selected from ethylene glycol di(meth)acrylate, hexanediol di(meth)acrylate, heptanediol di(meth)acrylate, octanediol di(meth)acrylate, nonanediol di(meth)acrylate, decanediol di(meth)acrylate, dodecanediol di(meth)acrylate, triethylpropane tri(meth)acrylate, pentaerythritol tri(meth)acrylate, pentaerythritol tetra(meth)acrylate, dipentaerythritol tri(meth)acrylate, dipentaerythritol tetra(meth)acrylate, and any combinations thereof.

The organic film forming composition may further include an initiator in addition to the above-described ingredients.

The amount of the metal (meth)acrylate may be about 0.1 to 10 parts by weight based on 100 parts by weight of the curable material.

According to one or more example embodiments of the present disclosure, an electronic apparatus includes: a substrate; an electronic device on the substrate; and a sealing layer covering the electronic device and including a number "q" of sealing units, each sealing unit including an organic film and an inorganic film that are sequentially stacked on the electronic device, wherein q is an integer of 1 or greater, and the organic film includes a cured product of an organic film forming composition according to an example embodiment of the present disclosure.

The electronic device may be selected from an organic light-emitting device (OLED), a liquid crystal display (LCD), a light-emitting diode (LED), an organic photovoltaic (OPV) cell, and an organic thin film transistor.

The cured product may be a polymer including: i) a repeating unit originating from the curable material, and ii) at least one moiety originating from the metal (meth)acrylate represented by Formula 1, wherein the moiety originating from the metal (meth) acrylate represented by Formula 1 may be selected from a) a repeating unit represented by Formula 10, and b) a terminal group represented by Formula 11:

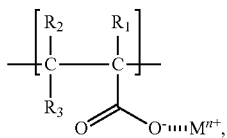

Formula 10

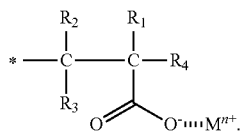

Formula 11

In Formulae 10 and 11,

M, n, and $R_1$ to $R_3$ may each independently be the same as described herein in connection with Formula 1;

$R_4$ may be the same as described herein in connection with $R_2$; and

* may be a binding site to a repeating unit originating from the curable material.

A water molecule that has penetrated into the sealing unit may be adsorbed to a carboxylate group (COO⁻) in Formulae 10 and/or 11 via a hydrogen bond, or may be adsorbed to a metal ion ($M^{n+}$) in Formulae 10 and/or 11 via an ion-dipole interaction.

The inorganic film may include a metal, a metal nitride, a metal oxide, a metal oxynitride, and/or a combination thereof.

The sealing layer may further include a lower inorganic film between the electronic device and the organic film.

The electronic apparatus may further include at least one selected from a capping layer and a protective layer between the electronic device and the sealing unit.

BRIEF DESCRIPTION OF THE DRAWINGS

These and/or other aspects will become apparent and more readily appreciated from the following description of the example embodiments, taken in conjunction with the accompanying drawings, in which.

DETAILED DESCRIPTION

Figure 1:
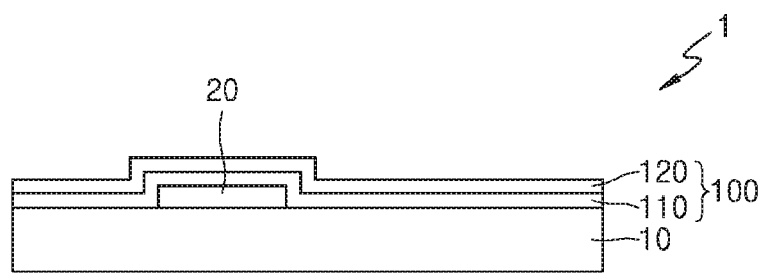
FIG. 1 is a schematic cross-sectional view of an organic light-emitting apparatus (as an example electronic apparatus) according to an embodiment of the present disclosure.

Reference will now be made in more detail to example embodiments, examples of which are illustrated in the accompanying drawings, wherein like reference numerals refer to like elements throughout and duplicative descriptions thereof may not be provided. In this regard, the present example embodiments may have different forms and should not be construed as being limited to the descriptions set forth herein. Accordingly, the example embodiments are merely described below, by referring to the drawings, to explain aspects of the present description. As used herein, the term "and/or" includes any and all combinations of one or more of the associated listed items. Expressions such as "at least one selected from", "one of", and "selected from", when preceding a list of elements, modify the entire list of elements and do not modify the individual elements of the list.

In the drawings, the thicknesses of layers, films, panels, regions, etc., may be exaggerated for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

According to an aspect of the present disclosure, an electronic apparatus includes: a substrate; an electronic device on the substrate; and a sealing layer covering the electronic device and including a number "q" of sealing units, each sealing unit including an organic film and an inorganic film that are sequentially stacked on the electronic device, wherein q is an integer selected from 1 or greater, and the organic film includes a cured product of an organic film forming composition according to an embodiment that will be described later.

The electronic device may be selected from an organic light-emitting device (OLED), a liquid crystal display (LCD), a light-emitting diode (LED), an organic photovoltaic (OPV) cell, and an organic thin film transistor.

FIG. 1 is a schematic cross-sectional view of an organic light-emitting apparatus 1 as an electronic apparatus according to an embodiment of the present disclosure.

Referring to FIG. 1, the organic light-emitting apparatus 1 may include a substrate 10, an organic light-emitting device 20 on the substrate 10, and a sealing layer 100 covering the organic light-emitting device 20.

In the organic light-emitting apparatus 1 of FIG. 1, the sealing layer 100 covering the organic light-emitting device 20 may prevent or reduce permeation of moisture from external environments into the organic light-emitting device 20. The sealing layer 100 may have a structure in which an organic film 110 and an inorganic film 120 alternate with each other (e.g., are stacked in alternating positions).

In the sealing layer 100 of FIG. 1, the organic film 110 and the inorganic film 120 sequentially stacked on the organic light-emitting device 20 may form (e.g., collectively form) a sealing unit. The sealing layer 100 may include one, two, or three sealing units. The sealing layer in FIG. 1 is illustrated as including one sealing unit. However, embodiments of the present disclosure are not limited thereto. As used herein, the phrase "sealing unit" may refer to a seal.

The organic film 110 may planarize a lower structure of the organic film 110 and provide flexible characteristics to (e.g., enable flexibility in) the sealing layer 100.

The organic film 110 may include a cured product of an organic film forming composition according to an embodiment of the present disclosure. For example, the organic film 110 may include a polymeric product of curing the organic film forming composition by exposure to light.

The organic film forming composition may include a metal (meth)acrylate represented by Formula 1; and a curable material:

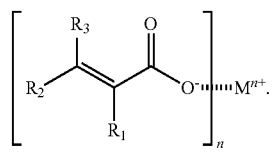

Formula 1

In Formula 1, M may be a metal atom.

For example, in Formula 1, M may be selected from lithium (Li), sodium (Na), calcium (Ca), zinc (Zn), magnesium (Mg), titanium (Ti), zirconium (Zr), and aluminum (Al).

In Formula 1, n may be an integer selected from 1 to 3.

In Formula 1, $R_1$ to $R_3$ may each independently be selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group.

For example, in Formula 1, $R_1$ to $R_3$ may each independently be selected from the group consisting of:

hydrogen, deuterium, —F, —Cl, —Br, —I, a hydroxyl group, a cyano group, a nitro group, an amino group, an amidino group, a hydrazino group, and a hydrazono group;

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group.

For example, in Formula 1, $R_1$ may be a $C_1$-$C_{10}$ alkyl group, and $R_2$ and $R_3$ may both be hydrogens; or $R_1$ to $R_3$ may all be hydrogens. However, embodiments of the present disclosure are not limited thereto.

In some embodiments, in Formula 1, $R_1$ may be selected from a methyl group, an ethyl group, a propyl group, a butyl group, a pentyl group, a hexyl group, a heptyl group, and an octyl group, and $R_2$ and $R_3$ may both be hydrogens; or $R_1$ to $R_3$ may all be hydrogens. However, embodiments of the present disclosure are not limited thereto.

In some embodiments, the metal (meth)acrylate may be represented by at least one selected from Formulae 1A to 1C:

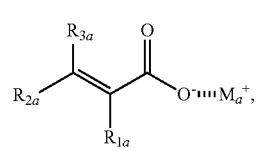

Formula 1A

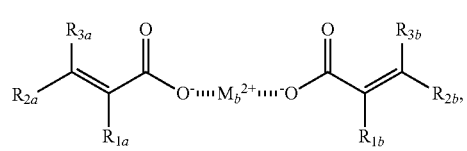

Formula 1B

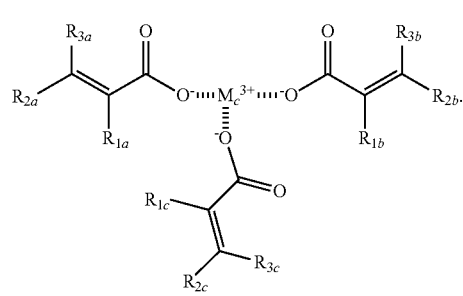

Formula 1C

In Formulae 1A to 1C, $M_a$ may be a monovalent metal; $M_b$ may be a divalent metal; $M_c$ may be a trivalent metal; $R_{1a}$ to $R_{1c}$ may each independently be the same as described herein in connection with $R_1$; $R_{2a}$ to $R_{2c}$ may each independently be the same as described herein in connection with $R_2$; and $R_{3a}$ to $R_{3c}$ may each independently be the same as described herein in connection with $R_3$.

For example, in Formulae 1A to 1C, $M_a$ may be selected from lithium (Li) and sodium (Na); $M_b$ may be selected from calcium (Ca), zinc (Zn), and magnesium (Mg); and $M_c$ may be aluminum (Al). However, embodiments of the present disclosure are not limited thereto.

For example, in Formulae 1A to 1C, $R_{1a}$ to $R_{1c}$, $R_{2a}$ to $R_{2c}$, and $R_{3a}$ to $R_{3c}$ may each independently be selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group.

In some embodiments, in Formulae 1A to 1C, $R_{1a}$ to $R_{1c}$, $R_{2a}$ to $R_{2c}$, and $R_{3a}$ to $R_{3c}$ may each independently be selected from the group consisting of:

hydrogen, deuterium, —F, —Cl, —Br, —I, a hydroxyl group, a cyano group, a nitro group, an amino group, an amidino group, a hydrazino group, and a hydrazono group;

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group.

In some embodiments, in Formulae 1A to 1C, $R_{1a}$ to $R_{1c}$, may each independently be a $C_1$-$C_{10}$ alkyl group, and $R_{2a}$ to $R_{2c}$ and $R_{3a}$ to $R_{3c}$ may all be hydrogens; or $R_{1a}$ to $R_{1c}$, $R_{2a}$ to $R_{2c}$, and $R_{3a}$ to $R_{3c}$ may all be hydrogens. However, embodiments of the present disclosure are not limited thereto.

In some embodiments, in Formulae 1A to 1C, $R_{1a}$ to $R_{1c}$ may each independently be selected from a methyl group, an ethyl group, a propyl group, a butyl group, a pentyl group, a hexyl group, a heptyl group, and an octyl group, and $R_{2a}$ to $R_{2c}$ and $R_{3a}$ to $R_{3c}$ may all be hydrogens; or $R_{1a}$ to $R_{1c}$, $R_{2a}$ to $R_{2c}$, and $R_{3a}$ to $R_{3c}$ may all be hydrogens. However, embodiments of the present disclosure are not limited thereto.

The metal (meth)acrylate of Formula 1 may be selected from sodium (meth)acrylate, lithium (meth)acrylate, calcium (meth)acrylate, magnesium (meth)acrylate, aluminum (meth)acrylate, and any combinations thereof.

As used herein, the term "(meth)acrylate" may refer to both acrylate and methacrylate.

The metal (meth)acrylate of Formula 1 that is included in the organic film forming composition for forming the organic film 110 as described above may be a starting material (e.g., reactant) in the curing reaction of the organic film forming composition. The metal (meth)acrylate of Formula 1 may form a chemical bond with the backbone of a curable material (which will be described later) during curing of the organic film forming composition to provide uniform (e.g., substantially uniform) hygroscopic properties (e.g., moisture-adsorbing abilities) to the organic film 110.

The organic film forming composition for forming the organic film 110 may further include a curable material, in addition to the metal (meth)acrylate of Formula 1.

As used herein, the term "curable material" refers to a material that may be cured by heat and/or light. The curable material may serve as a starting material (e.g., reactant) in the curing reaction of the organic film forming composition together with the metal (meth)acrylate of Formula 1 to provide uniform (e.g., substantially uniform) hygroscopic properties (e.g., moisture-adsorbing abilities) to the organic film 110.

For example, the curable material may have at least two curable groups selected from the groups represented by Formulae 2A to 2D:

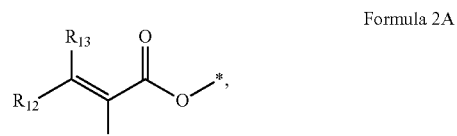

Formula 2A

Formula 2B

Formula 2C

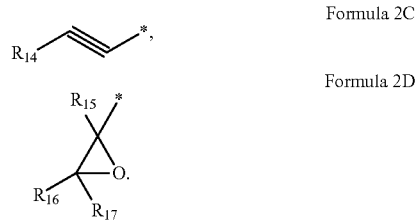

Formula 2D

In Formulae 2A to 2D, $R_{11}$ may be the same as described herein in connection with $R_1$;

$R_{12}$ may be the same as described herein in connection with $R_2$;

$R_{13}$ may be the same as described herein in connection with $R_3$;

$R_{14}$ to $R_{17}$ may each independently be selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group; and

* may indicate a binding site to the backbone of the curable material.

The curable material may have at least two curable groups selected from the groups represented by Formulae 2A to 2D, and the at least two curable groups may be the same as or different from each other.

For example, the curable material may have at least two curable groups represented by Formula 2A, and the at least two curable groups may be the same as or different from each other.

In some embodiments, the curable material may have a curable group represented by Formula 2A and a curable group represented by Formula 2B. However, embodiments of the present disclosure are not limited thereto. The curable group may include at least two curable groups as any combination of the curable groups represented by Formulae 2A to 2D.

In some embodiments, the curable material may be represented by Formula 3:

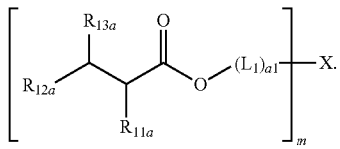

Formula 3

In Formula 3, $R_{11a}$ may be the same as described herein in connection with $R_1$;

$R_{12a}$ may be the same as described herein in connection with $R_2$;

$R_{13a}$ may be the same as described herein in connection with $R_3$;

X may be selected from the group consisting of: a $C_1$-$C_{30}$ hydrocarbon group; and a $C_1$-$C_{30}$ hydrocarbon group substituted with at least one selected from deuterium, —F, —Cl, —Br, —I, a hydroxyl group, a cyano group, a nitro group, an amino group, an amidino group, a hydrazino group, a hydrazono group, and a $C_1$-$C_{10}$ alkyl group;

$L_1$ may be selected from *—$CH_2$—O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

a1 may be an integer selected from 0 to 2;

m may be an integer of 2 or greater; and

* and *' may each independently be a binding site to an adjacent atom.

For example, in Formula 3, $L_1$ may be selected from *—$CH_2$—O—*', a $C_1$-$C_{10}$ alkylene group, and a $C_1$-$C_{10}$ alkylene group substituted with at least one selected from deuterium, —F, —Cl, —Br, —I, a hydroxyl group, a cyano group, a nitro group, an amino group, an amidino group, a hydrazino group, a hydrazono group, and a $C_1$-$C_{10}$ alkyl group.

In some embodiments, the curable material may be represented by at least one selected from Formulae 3A to 3C. However, embodiments of the present disclosure are not limited thereto:

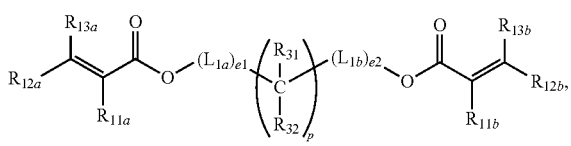

Formula 3A

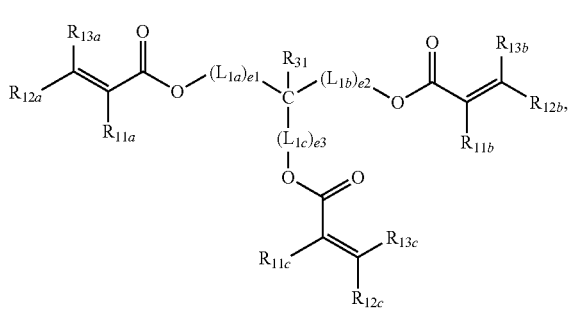

Formula 3B

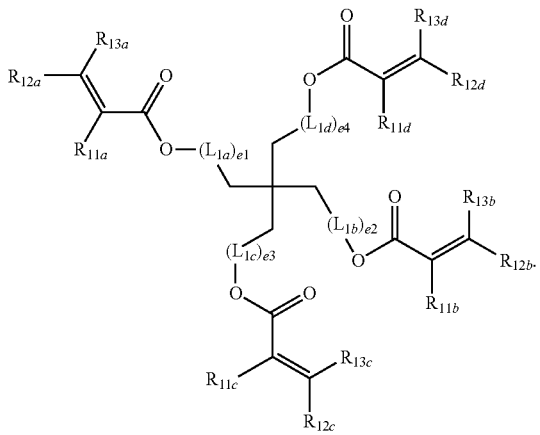

Formula 3C

In Formulae 3A to 3C, $L_{1a}$ to $L_{1d}$ may each independently be selected from *—$CH_2$—O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

e1 to e4 may each independently be an integer selected from 0 to 2;

$R_{11a}$ to $R_{11d}$ may each independently be the same as described herein in connection with $R_1$;

$R_{12a}$ to $R_{12d}$ may each independently be the same as described herein in connection with $R_2$;

$R_{13a}$ to $R_{13d}$ may each independently be the same as described herein in connection with $R_3$;

$R_{31}$ and $R_{32}$ may each independently be selected from the group consisting of:

hydrogen, deuterium, —F, —Cl, —Br, —I, a hydroxyl group, a cyano group, a nitro group, an amino group, an amidino group, a hydrazino group, and a hydrazono group;

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group; and p may be an integer selected from 1 to 30, wherein *—C($R_{31}$)($R_{32}$)—*'(s) may be the same as or different from each other when p is 2 or greater.

For example, in Formulae 3A to 3C, $R_{11a}$ to $R_{11d}$, $R_{12a}$ to $R_{12d}$, and $R_{13a}$ to $R_{13d}$ may each independently be selected from the group consisting of:

hydrogen, deuterium, —F, —Cl, —Br, —I, a hydroxyl group, a cyano group, a nitro group, an amino group, an amidino group, a hydrazino group, and a hydrazono group;

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group.

In some embodiments, the curable material may be selected from ethylene glycol di(meth)acrylate, hexanediol di(meth)acrylate, heptanediol di(meth)acrylate, octanediol di(meth)acrylate, nonanediol di(meth)acrylate, decanediol di(meth)acrylate, dodecanediol di(meth)acrylate, triethylpropane tri(meth)acrylate, pentaerythritol tri(meth)acrylate, pentaerythritol tetra(meth)acrylate, dipentaerythritol tri(meth)acrylate, dipentaerythritol tetra(meth)acrylate, and any combinations thereof.

For example, the amount of the metal (meth)acrylate of Formula 1 in the organic film forming composition may be about 0.1 to 10 parts by weight, and in some embodiments, about 0.1 to 5 parts by weight, based on 100 parts by weight of the curable material. When the amount of the metal (meth)acrylate with respect to the curable material is within these ranges, the organic film 110 may substantially prevent or reduce permeation of moisture into the organic light-emitting device 20, may have improved planarization characteristics, and may be more easily applied to a target region where the organic film 110 is to be formed (e.g., a suitable amount of metal (meth)acrylate may facilitate application of the organic film forming composition).

The organic film 110 may include a cured product of the organic film forming composition, obtained using the following curing methods.

The cured product may be a polymer including i) a repeating unit originating from the curable material, and ii) at least one moiety originating from the metal (meth)acrylate represented by Formula 1, and the moiety originating from the metal (meth)acrylate represented by Formula 1 may be selected from a) a repeating unit represented by Formula 10, and b) a terminal group represented by Formula 11:

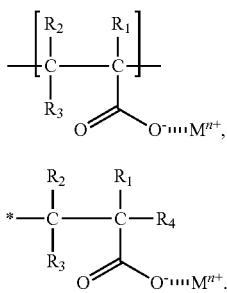

Formula 10

Formula 11

In Formulae 10 and 11,

M, n, and $R_1$ to $R_3$ may each independently be the same as described herein;

$R_4$ may be the same as described herein in connection with $R_2$; and

* may be a binding site to a repeating unit originating from the curable material.

For example, the cured product may be a polymer including: i) a repeating unit originating from the curable material, and ii) a repeating unit represented by Formula 10 originating from the metal (meth)acrylate represented by Formula 1.

In some embodiments, the cured product may be a polymer including: i) a repeating unit originating from the curable material; and ii) a terminal group represented by Formula 11 originating from the metal (meth)acrylate represented by Formula 1.

In some embodiments, the cured product may be a polymer including: i) a repeating unit originating from the curable material; ii) a repeating unit represented by Formula 10 originating from the metal (meth)acrylate represented by Formula 1; and iii) a terminal group represented by Formula 11 originating from the metal (meth)acrylate represented by Formula 1.

As described above, the cured product may include a moiety originating from the metal (meth)acrylate represented by Formula 1 to allow water molecules that have permeated into the sealing unit to be adsorbed to a carboxylate group ($COO^-$) in Formulae 10 and/or 11 via a hydrogen bond or to a metal ion ($M^{n+}$) in Formulae 10 and/or 11 via an ion-dipole interaction, and may thus improve the hygroscopic efficiency (e.g. efficiency of moisture adsorption) of the organic film 110. The binding energy of the ion-dipole interaction may be higher than the binding energy of the hydrogen bond, and the adsorption ability of water molecules may be further improved, with a reduced likelihood of desorption of the adsorbed water molecules. Accordingly, the organic film 110 may have improved hygroscopic properties (e.g., moisture-adsorbing abilities).

In some embodiments, the organic film forming composition may further include an initiator, in addition to the curable material and the metal (meth)acrylate of Formula 1.

The initiator may be selected from any suitable material available in the art to initiate the curing reaction of the organic film forming composition as described above.

For example, the initiator may be selected from thermal initiators (including an organic peroxide compound and/or an azo compound), and photoinitiators (including a benzophenone compound, an oxime compound, and/or a phosphine oxide compound), but embodiments of the present disclosure are not limited thereto.

Non-limiting examples of the organic peroxide compound may include benzoyl peroxide, t-butyl perbenzoate, o-methylbenzoyl peroxide, p-methylbenzoyl peroxide, di-t-butyl peroxide, dicumyl peroxide, 1,1-bis(t-butylperoxy)-3,3,5-trimethyl cyclohexane, 1, 1-d i(t-butylperoxy)cyclohexane, 2,5-dimethyl-2,5-di(t-butylperoxy)hexane, 2,5-dimethyl-2, 5-di(t-butylperoxy)hexane, 1,6-bis(p-toluoylperoxy carbonyloxy)hexane, and di(4-methylbenzoyl peroxy)hexamethylene bis-carbonate.

Non-limiting examples of the azo compound may include 2'-azobis(4-methoxy-2,4-dimethyl valeronitrile, 2,2'-azobis (2,4-dimethyl)valeronitrile, azobis isobutyronitrile (AIBN), and 2,2'-azobis(2-methylbutyronitrile).

Non-limiting examples of the benzophenone compound may include 2-hydroxy-2-methyl-1-phenyl-1-propanone, 2-hydroxy-1-[4-(2-hydroxyethoxy)phenyl]-2-methyl-1-propanone, alpha-dimethoxy-alpha-phenylacetophenone, 2-benzyl-2-(dimethylamino)-1-[4-(4-morpholinyl) phenyl]-1-butanone, and 2-methyl-1-[4-(methylthio)phenyl]-2-(4-morpholinyl)-1-propanone.

Non-limiting examples of the oxime compound may include (hydroxyimino)cyclohexane, 1-[4-(phenylthio)phenyl]-octane-1,2-dione-2-(O-benzoyloxime), 1-[9-ethyl-6-(2-methylbenzoyl)-9H-carbazol-3-yl]-ethanone-1-(O-acetyloxime), trichloromethyl-triazine derivatives), 4-(4-methoxystyryl)-2,6-trichloromethyl-1,3,5-triazine), 4-(4-methoxyphenyl)-2,6-trichloromethyl-1,3,5-triazine, and α-aminoketone (1-(4-morpholinophenyl)-2-dimethylamino-2-benzyl-butan-1-one).

Non-limiting examples of the phosphine oxide compound may include diphenyl (2,4,6-trimethylbenzoyl)-phosphine oxide (TPO) and phenylbis(2,4,6-trimethyl benzoyl) phosphine oxide (BAPO).

The amount of the initiator may be any suitable amount at which the curing reaction of the metal (meth)acrylate and the curable material as described above may be initiated. For example, the amount of the initiator may be about 0.1 to about 5 parts by weight, and in some embodiments, about 1 to about 4 parts by weight, based on 100 parts by weight of the curable material, but embodiments of the present disclosure are not limited thereto.

The organic film 110 may have a thickness of about 0.1 µm to about 50 µm, and in some embodiments, about 1 µm to about 20 µm. When the thickness of the organic film 110 is within these ranges, the lower surface of the organic film 110 may be effectively planarized. When the sealing layer 100 includes at least two organic films 110, the thicknesses of the at least two organic films 110 may be the same as or different from each other. The inorganic film 120 may prevent or reduce permeation of moisture and/or oxygen from external environments into the organic light-emitting device 20.

The inorganic film 120 may include a material selected from suitable inorganic materials available in the related art as materials for a sealing layer. For example, the inorganic film 120 may include a metal, a metal nitride, a metal oxide, a metal oxynitride, or a combination thereof. For example, the inorganic film 120 may include aluminum nitride, aluminum oxide, aluminum oxynitride, or a combination thereof. However, embodiments of the present disclosure are not limited thereto. In some embodiments, the inorganic film 120 may include $SiO_2$, SiC, SiN, SiON, $In_2O_3$, $TiO_2$, $Al_2O_3$, or a combination thereof. However, embodiments of the present disclosure are not limited thereto. When the sealing layer 100 includes at least two inorganic films 120, the at least two inorganic films may include the same material or different materials.

The inorganic film 120 may have a thickness of about 100 Å to about 5,000 Å, and in some embodiments, about 500 Å to about 3,000 Å. However, embodiments of the present disclosure are not limited thereto. When the thickness of the inorganic film 120 is within these ranges, the sealing layer 100 may have improved sealing characteristics.

The inorganic film 120 may be formed using, for example, sputtering, reactive sputtering, chemical vapor deposition (CVD), plasma-enhanced chemical vapor deposition (PECVD), evaporation, electron cyclotron resonance-plasma enhanced chemical vapor deposition (ECR-PECVD), physical vapor deposition, and/or atomic layer deposition.

The sealing layer 100 of the organic light-emitting apparatus 1 may further include a lower inorganic film between the organic light-emitting device 20 and the sealing layer 100. The lower inorganic film may further enhance prevention or reduction of moisture and/or oxygen permeation into the organic light-emitting device 20. The description of the lower inorganic film may be substantially similar to the above-detailed description of the inorganic film 110.

The sealing layer 100 may have a thickness of about 0.1 µm to about 1,000 µm, and in some embodiments, about 1 µm to about 10 µm. However, embodiments of the present disclosure are not limited thereto. When the thickness of the sealing layer 100 is within these ranges, the sealing layer 100 may effectively prevent or reduce permeation of moisture and/or oxygen into the organic light-emitting device 20, and may have flexible characteristics (e.g., may be flexible).

Although not illustrated in FIG. 1, at least one selected from a capping layer and a protective layer may be between the organic light-emitting device 20 and the sealing layer 100.

The capping layer may induce constructive interference of light emitted from the organic light-emitting device 20, and thus enhance light extraction efficiency. The capping layer may be formed of a material having a relatively high refractive index. For example, the capping layer may include an organic metal complex, such as $Alq_3$, a silicon oxide, and/or a silicon nitride, but embodiments of the present disclosure are not limited thereto.

The protective layer may prevent or reduce damage of the organic light-emitting device 20, which may occur during the formation of the sealing layer 100. For example, the protective layer may include a silicon oxide and/or a silicon nitride, but embodiments of the present disclosure are not limited thereto.

Description of FIG. 1

A method of manufacturing the organic light-emitting apparatus 1 of FIG. 1, according to an embodiment of the present disclosure will be described below.

The organic light-emitting device 20 may be on the substrate 10. The substrate 10 may be any suitable substrate that is available for organic light-emitting devices in the related art. In some embodiments, the substrate 10 may be a glass substrate or a transparent plastic substrate, each with strong mechanical strength, thermal stability, transparency, surface smoothness, ease of handling, and/or water resistance.

For example, the substrate 10 may be formed of an inorganic material (such as a transparent glass material including $SiO_2$ as a main ingredient) or an insulating organic material (such as a transparent plastic material). For example, the insulating organic material may be selected from polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (CTA), and cellulose acetate propionate (CAP), but embodiments of the present disclosure are not limited thereto.

The organic light-emitting device 20 may include an organic layer (for example, a hole injection layer, a hole transport layer, a buffer layer, an electron transport layer, an electron injection layer, and/or the like). Methods of forming these organic layers will be described later.

Subsequently, the lower inorganic film may be formed to cover the light-emitting device 20 using sputtering, reactive sputtering, chemical vapor deposition (CVD), plasma-enhanced chemical vapor deposition (PECVD), evaporation, electron cyclotron resonance plasma-enhanced chemical vapor deposition (ECR-PECVD), physical vapor deposition, atomic-layer deposition, and/or the like. The thickness and material of the lower inorganic film may be similar to those of the inorganic film 120 described above.

Next, a composition for forming the organic film 110 may be applied onto the lower inorganic film and then cured, thereby forming the organic film 110. The detailed description of the composition for forming the organic film 110, including the thickness of the organic film 110, may be similar to that of the "organic film forming composition" above.

The composition for forming the organic film 110 onto the lower inorganic film may be applied using any suitable method available in the art (such as screen printing, flash evaporation, spin coating, dip coating, and/or inkjet printing, but embodiments of the present disclosure are not limited thereto). The composition for forming the organic film 110 applied onto the lower inorganic film may be cured using any suitable curing method involving exposure to light (e.g., radiation), for example, UV curing, infrared ray curing, laser curing, and/or the like, but embodiments of the present disclosure are not limited thereto.

Subsequently, the inorganic film 120 is formed on the organic film 110 to thereby form a sealing unit. The inorganic film 120 may be formed using, for example, sputtering, reactive sputtering, chemical vapor deposition (CVD), plasma-enhanced chemical vapor deposition (PECVD), evaporation, electron cyclotron resonance-plasma enhanced chemical vapor deposition (ECR-PECVD), physical vapor deposition, atomic-layer deposition, and/or the like. The material and thickness of the inorganic film 120 may be similar to (e.g., substantially the same as) the inorganic film 120 described above.

When the organic light-emitting apparatus 1 further includes at least one selected from a capping layer and a protective layer between the organic light-emitting device 20 and the sealing layer 100, the at least one selected from a capping layer and a protective layer may be formed on the organic light-emitting device 20 before the formation of the sealing layer 100.

Embodiments of the electronic apparatus are not limited to the organic light-emitting apparatus 1 of FIG. 1. Examples of an organic light-emitting device (as an example electronic apparatus) according to the present disclosure are also not limited to the organic light-emitting apparatus 1 of FIG. 1. For example, regarding the sealing layer 100 of the organic light-emitting apparatus 1, q may be an integer selected from 1 to 10. In some embodiments, q may be selected from 1, 2, 3, 4, and 5, but embodiments of the present disclosure are not limited thereto. In some embodiments, when the sealing layer includes at least two sealing units, another layer (for example, any organic layer and/or inorganic layer available as a sealing layer in organic light-emitting apparatuses of the related art) may be between adjacent sealing units. However, embodiments of the present disclosure are not limited thereto.

As used herein, the expression "(at least two different layers are) sequentially stacked" refers to that at least two different layers are positioned upon one another in the vertical direction. In this regard, the method of stacking the at least two different layers may be any suitable method available in the related art. Furthermore, another layer may be between the at least two different layers.

Hereinafter, a structure of the organic light-emitting device 20 in FIG. 1 will be described in greater detail.

First Electrode

The first electrode may be formed by depositing and/or sputtering a first electrode-forming material on the substrate. When the first electrode is an anode, a material having a high work function may be selected as a material for the first electrode to facilitate hole injection.

The first electrode may be a reflective electrode, a semi-transmissive electrode, or a transmissive electrode. When the first electrode is a transmissive electrode, a material for the first electrode may be selected from indium tin oxide (ITO), indium zinc oxide (IZO), tin oxide ($SnO_2$), zinc oxide (ZnO), and combinations thereof, but embodiments of the present disclosure are not limited thereto. When the first electrode is a semi-transmissive or a reflective electrode, a material for the first electrode may be selected from magnesium (Mg), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode may have a single-layer structure or a multi-layer structure including a plurality of layers. For example, the first electrode may have, but is not limited to, a three-layered structure including ITO, Ag, and ITO layers.

Organic Layer

The organic light-emitting device 20 may include an organic layer on the first electrode. The organic layer may include an emission layer (EML). The organic layer may further include a hole transport region between the first electrode and the emission layer, and an electron transport region between the emission layer and the second substrate.

Hole Transport Region in Organic Layer

The hole transport region may have: i) a single-layer structure having a single layer including a single material, ii) a single-layer structure having a single layer including a plurality of different materials, or iii) a multi-layer structure having a plurality of layers including different materials.

For example, the hole transport region may include at least one layer selected from a hole injection layer (HIL), a hole transport layer (HTL), an emission auxiliary layer, and an electron blocking layer (EBL).

For example, the hole transport region may have a single-layer structure having a single layer including a plurality of different materials, or a multi-layer structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein layers of each structure are sequentially stacked on the first electrode in each stated order. However, embodiments of the present disclosure are not limited thereto.

The hole transport region may include at least one selected from m-MTDATA, TDATA, 2-TNATA, NPB (NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly (4-styrenesulfonate) (PEDOT/PSS), polyaniline/camphor sulfonic acid (PANI/CSA), and polyaniline/poly(4-styrene sulfonate) (PANI/PSS):

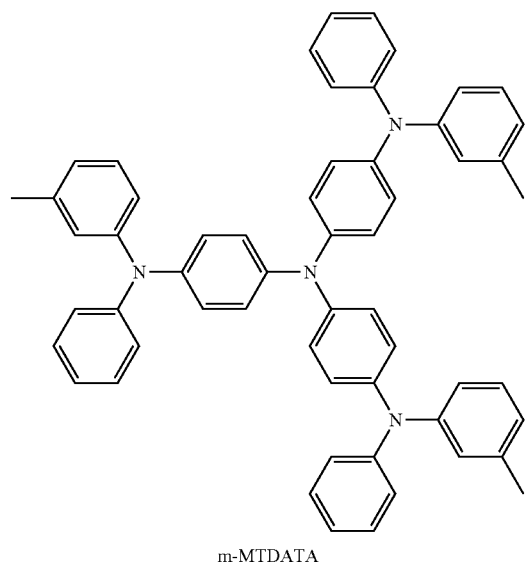

m-MTDATA

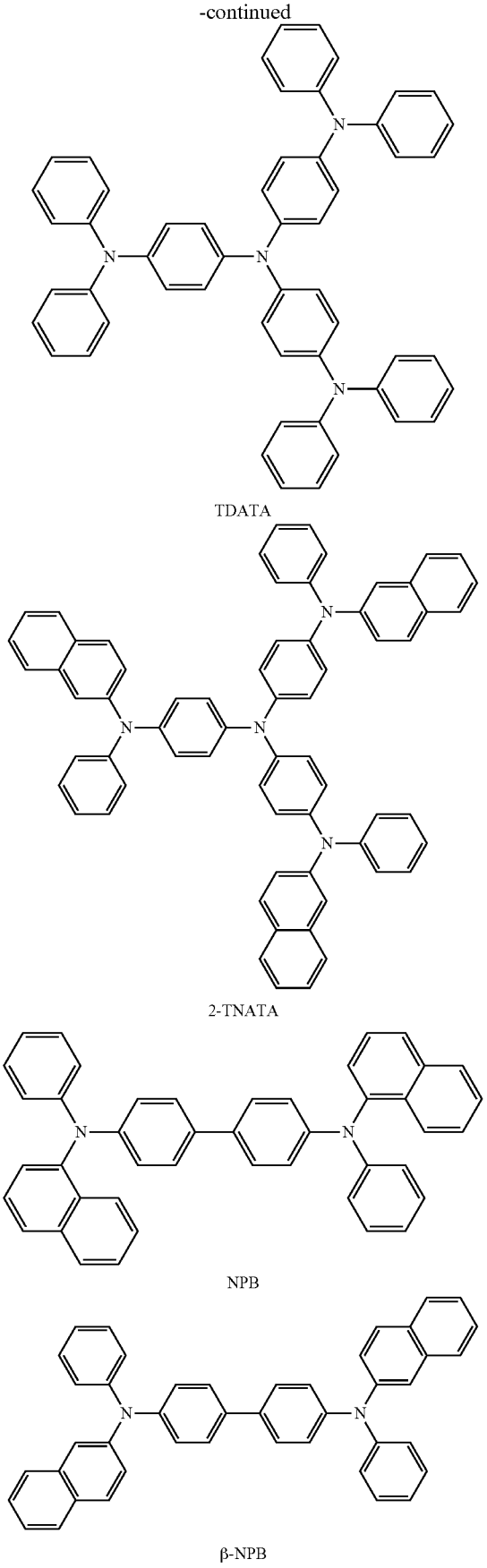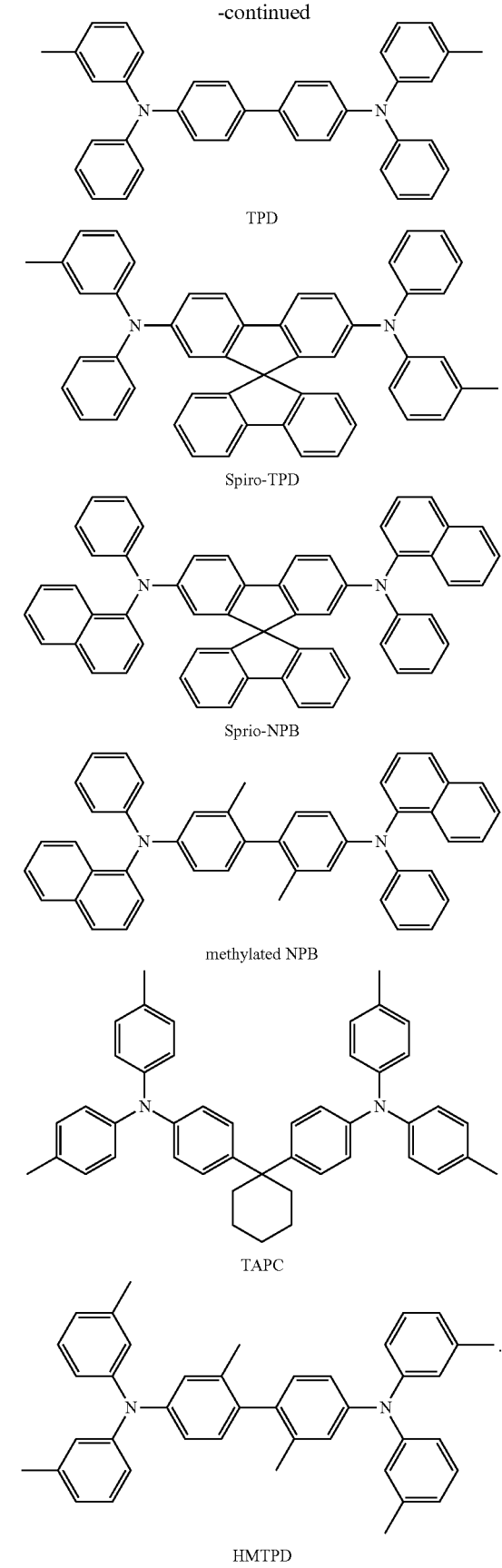

p-dopant

The hole transport region may further include a charge-generating material to improve conductivity, in addition to the above-described materials. The charge-generating material may be homogeneously or inhomogeneously dispersed in the hole transport region.

The charge-generating material may be, for example, a p-dopant. The p-dopant may be at least one selected from a quinine derivative, a metal oxide, and a cyano group-containing compound, but embodiments of the present disclosure are not limited thereto.

Emission Layer in )Organic Layer

When the organic light-emitting device 20 is a full-color organic light-emitting device, the emission layer may be patterned into a red emission layer, a green emission layer, and a blue emission layer to correspond to individual subpixels. In some embodiments, the emission layer may have a stacked structure including at least two selected from a red emission layer, a green emission layer, and a blue emission layer. The layers may be stacked upon one another to be in contact with each other, or may be separated from one another. In some embodiments, the at least two materials selected from a red emission material, a green emission material, and a blue emission material may be mixed together without separation of layers to thereby emit white light.

The emission layer may include both a host and a dopant. The dopant may include at least one selected from a phosphorescent dopant and a fluorescent dopant.

Host in emission layer

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1
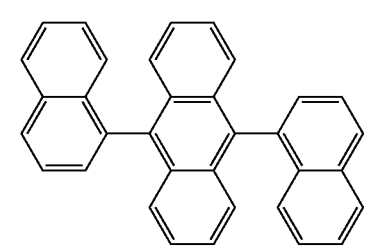

H2
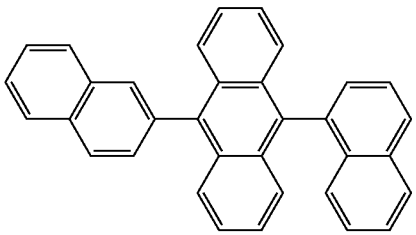

H3
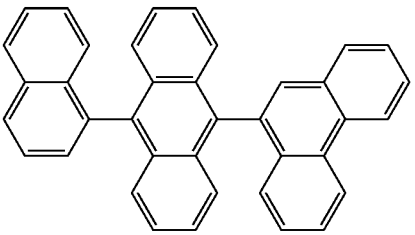

H4
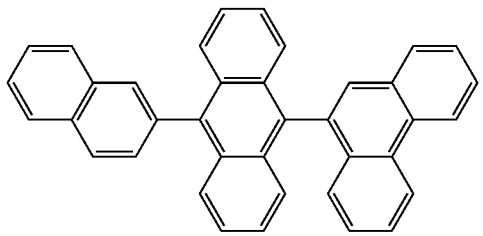

H5
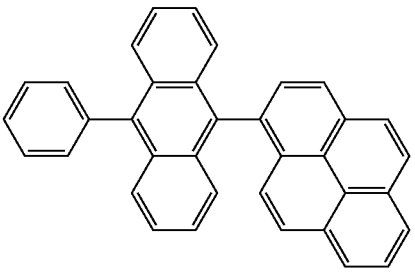

H6
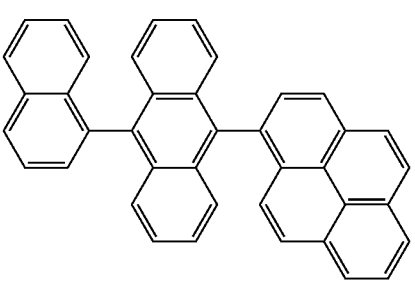

H7
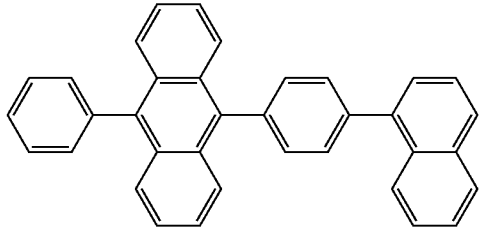

H8
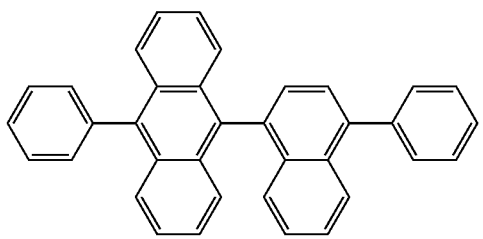

H9
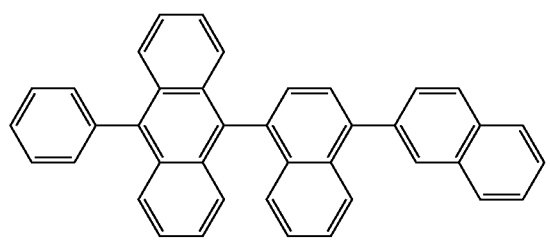
H10
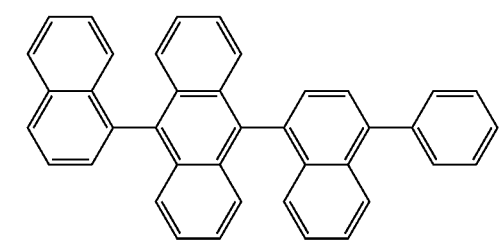
H11
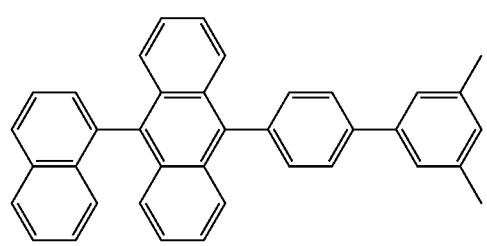
H12
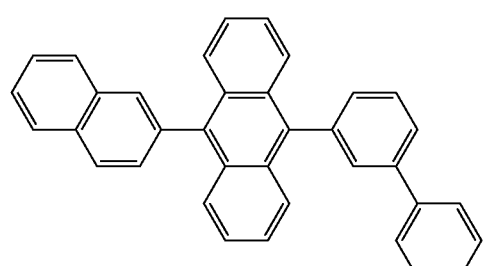
H13
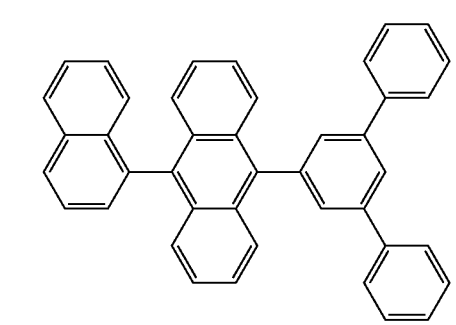
H14
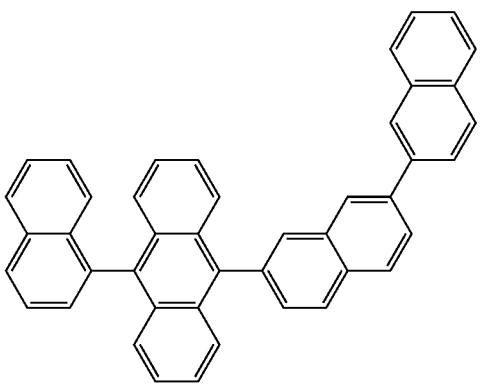
H15
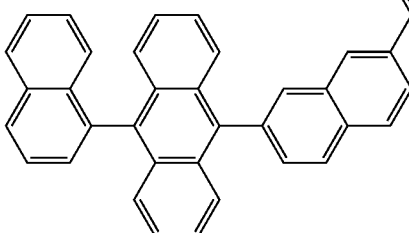
H16
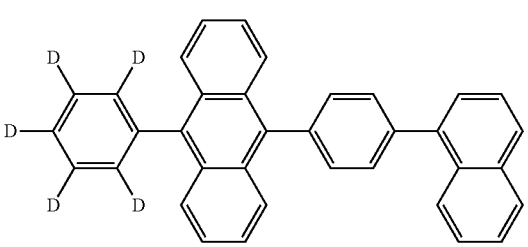
H17
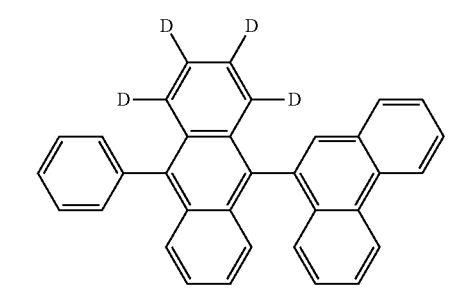
H18
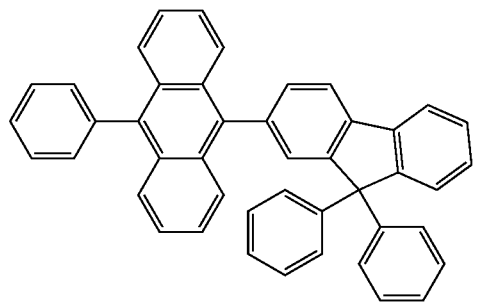

-continued
H19
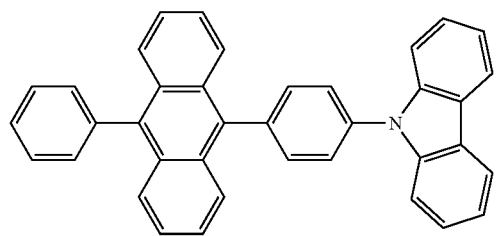
H20
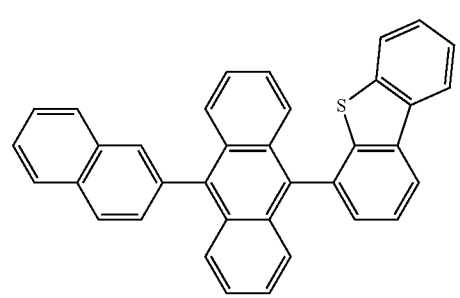
H21
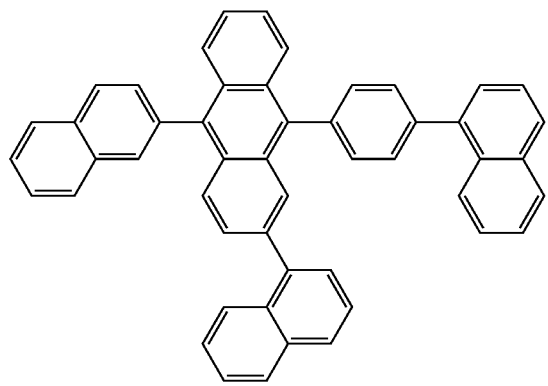
H22
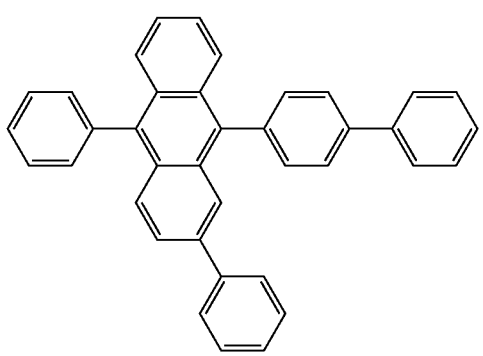
-continued
H23
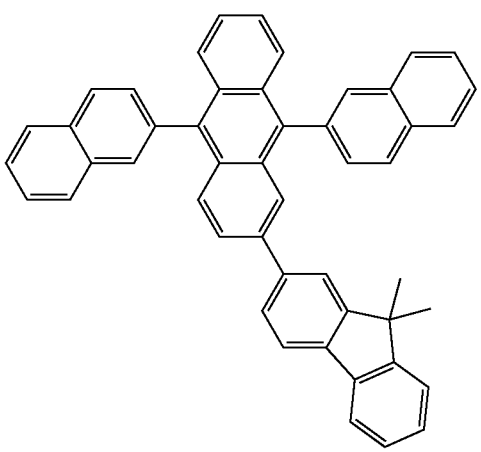
H24
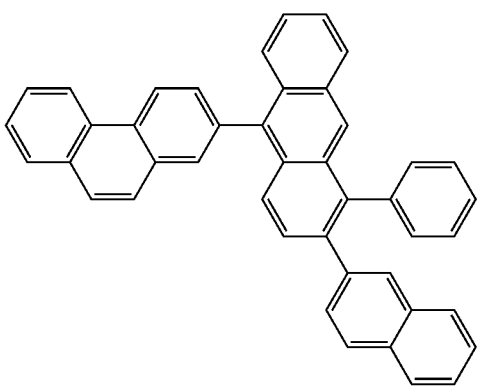
H25
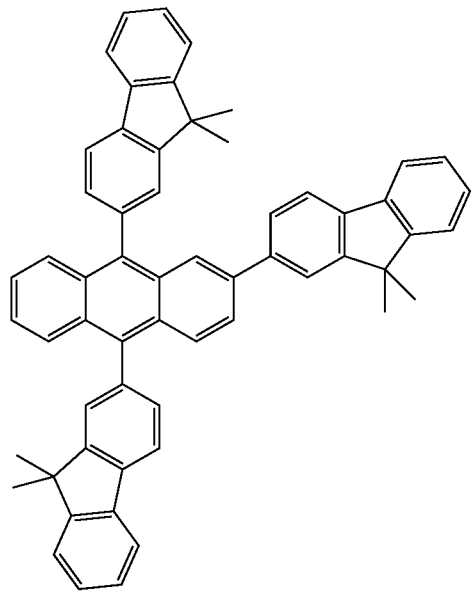

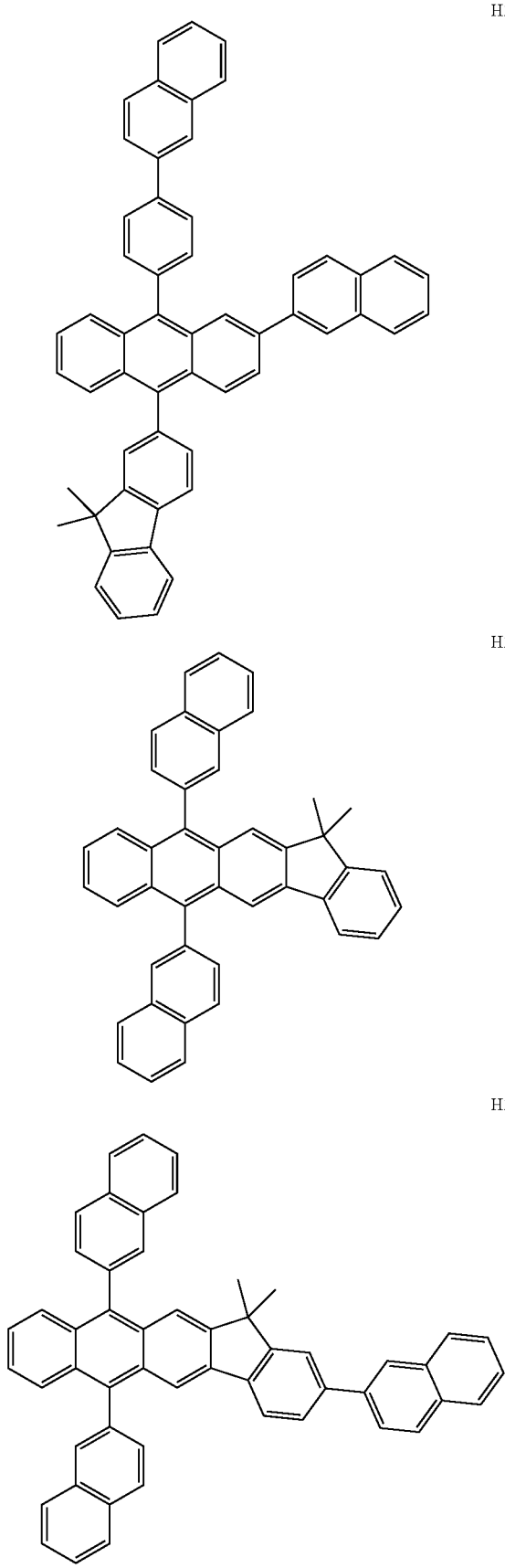
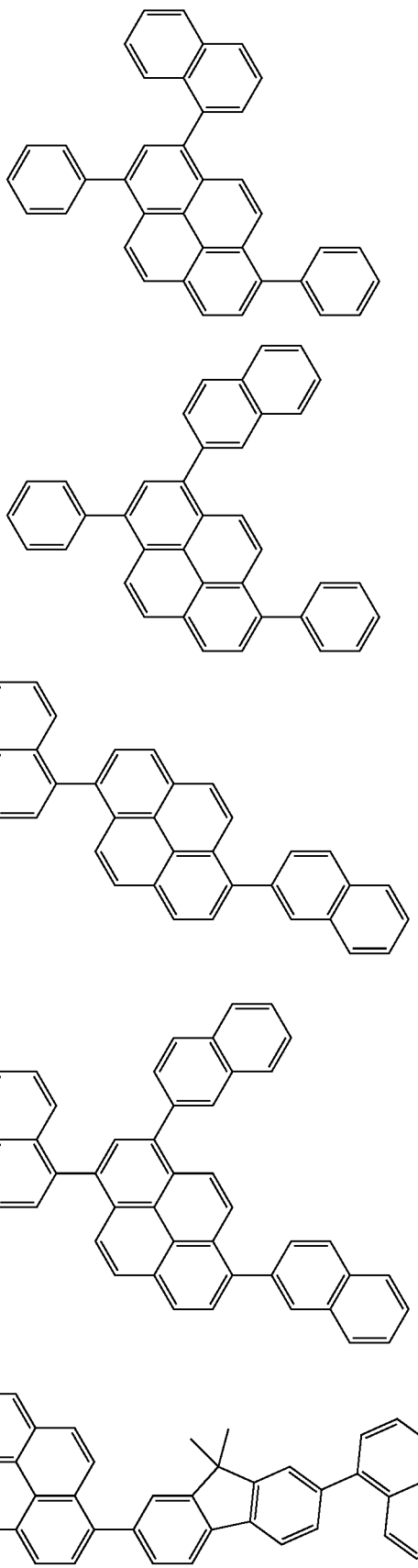

H34
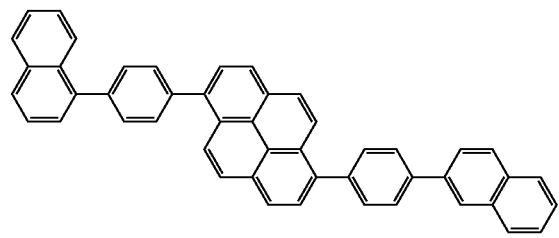
H35
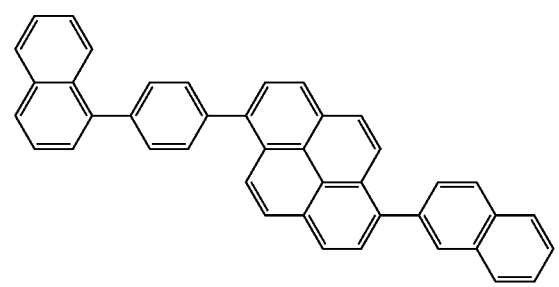
H36
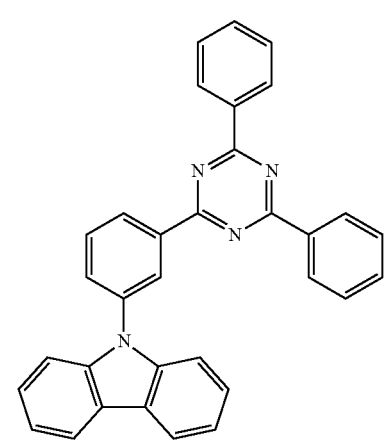
H37
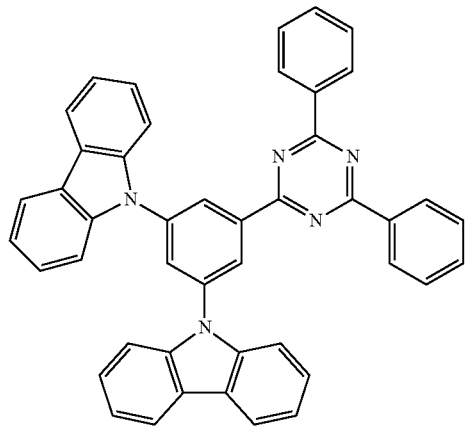
H37
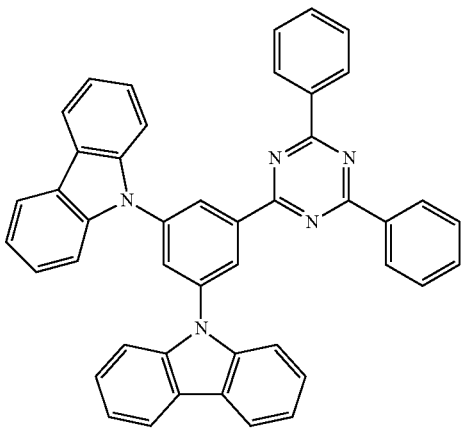
H38
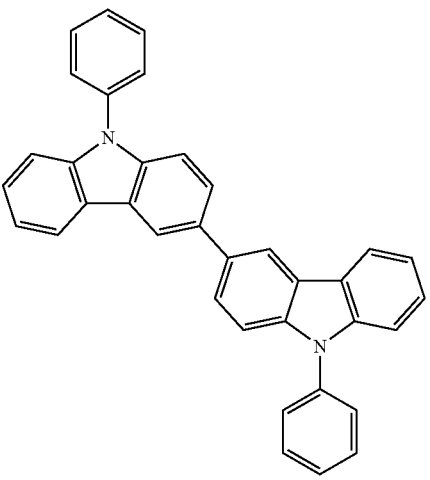
H39

H40
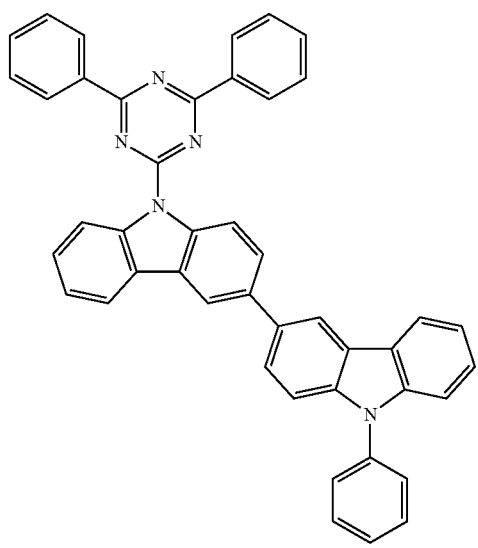
H41
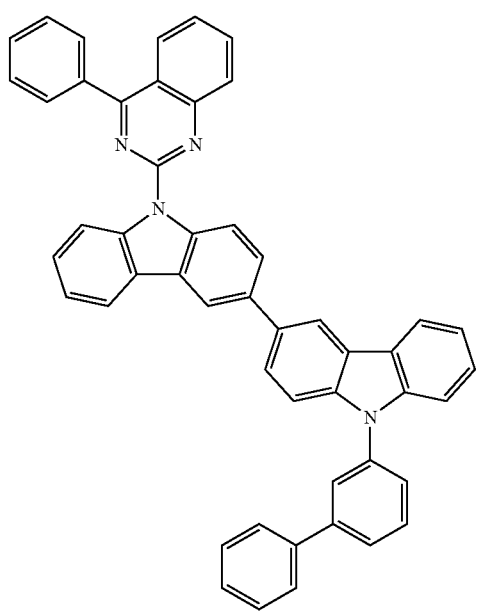
H42
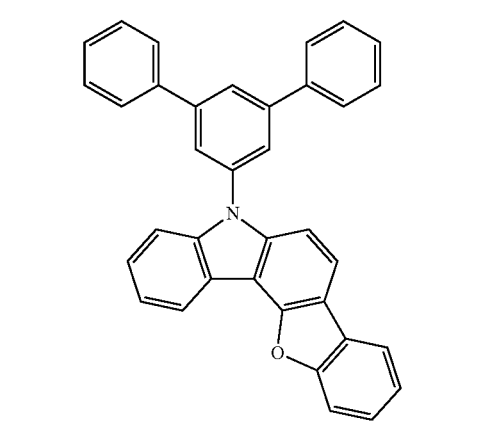
H43
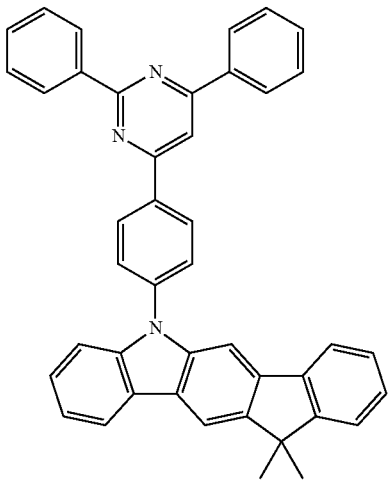
H44
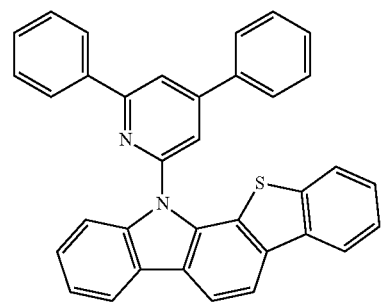
H45
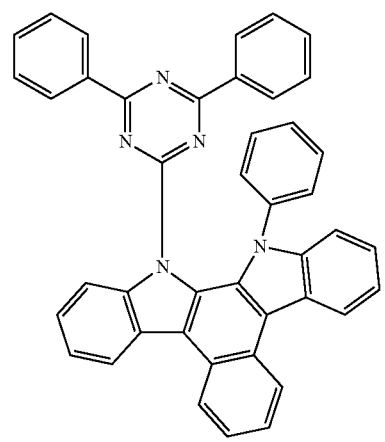
H46
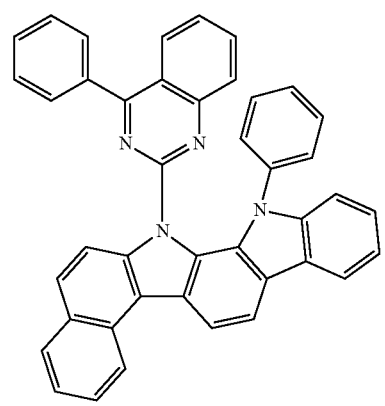

-continued
H47
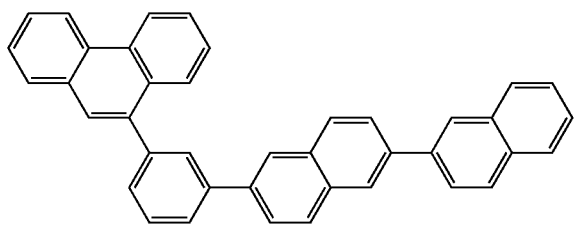
H48
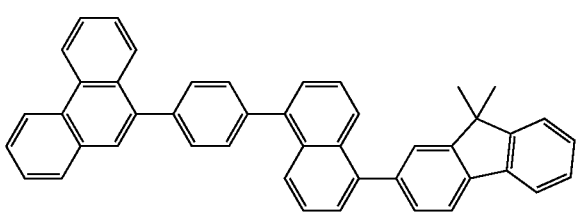
H49
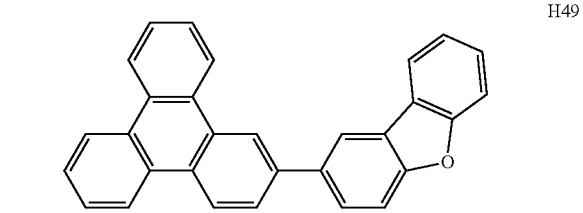
H50
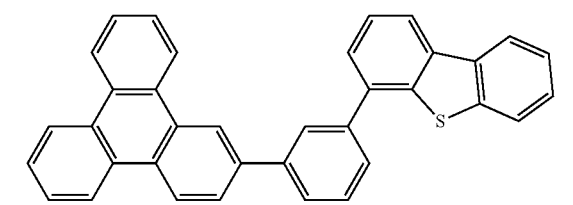
H51
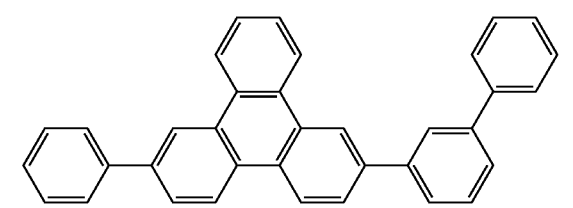
H52
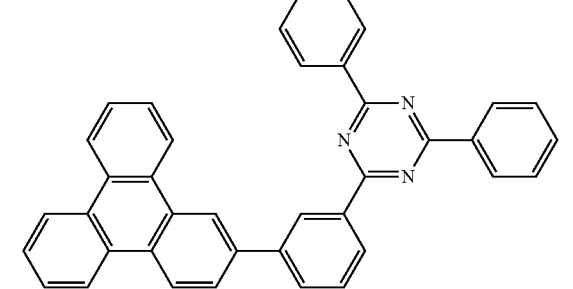
-continued
H53
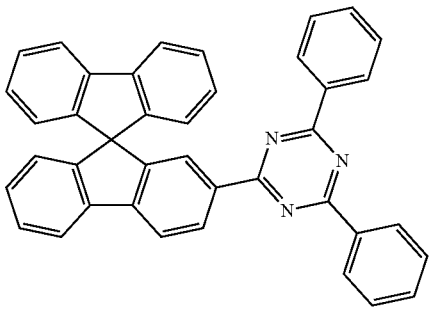
H54
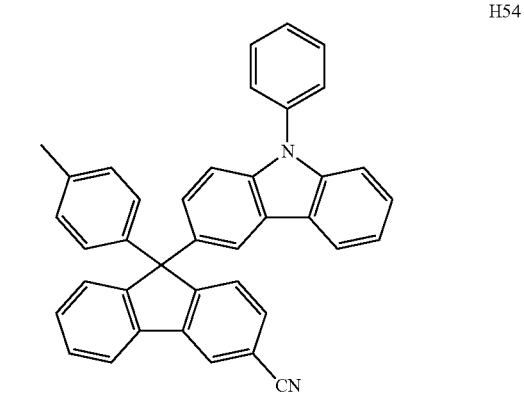
H55
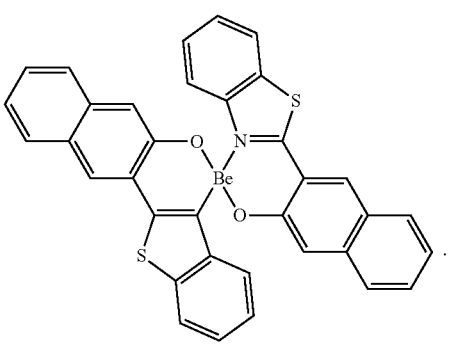
Phosphorescent Dopant in Emission Layer in Organic Layer
In some embodiments, the phosphorescent dopant may be selected from Compounds PD1 to PD25, but embodiments of the present disclosure are not limited thereto:
PD1
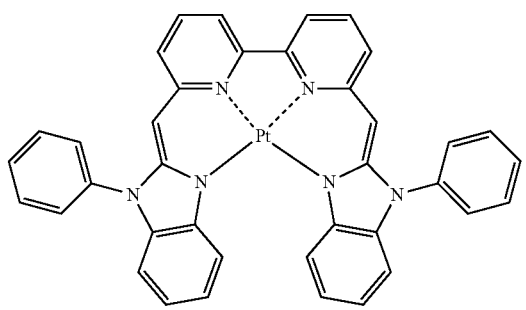

PD2
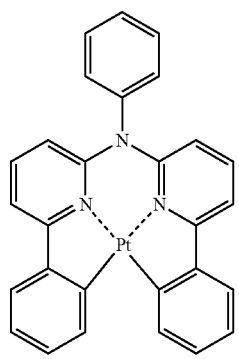
PD3
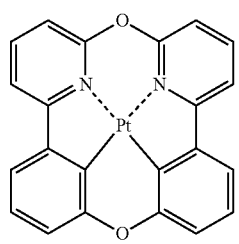
PD4
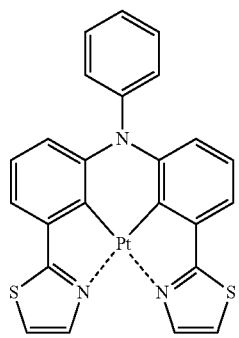
PD5
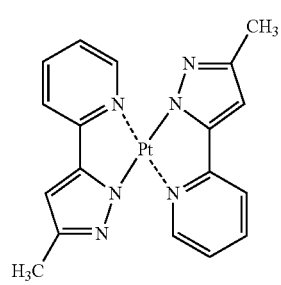
PD6
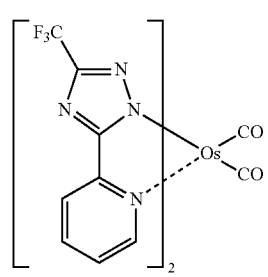
PD7
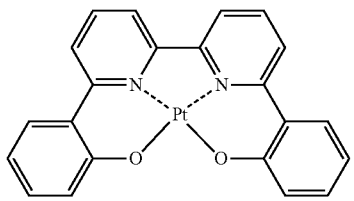
PD8
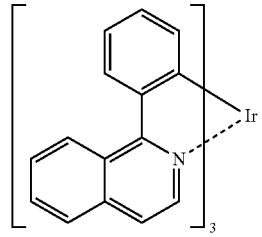
PD9
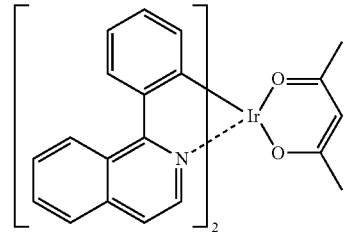
PD10
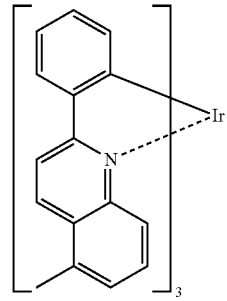
PD11
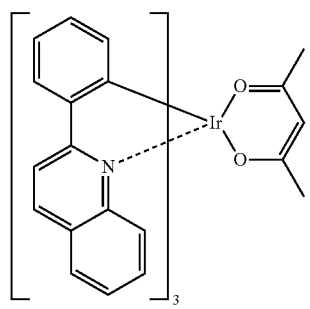

PD12 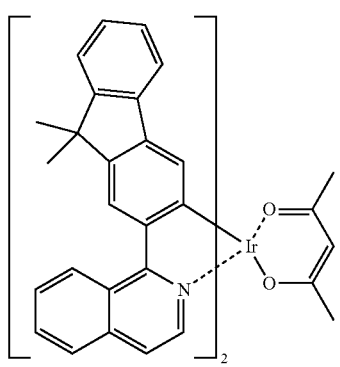
PD13 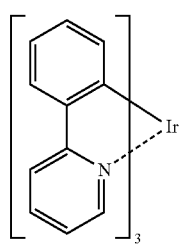
PD14 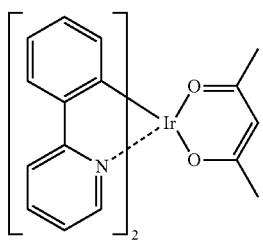
PD15 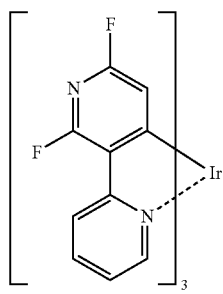
PD16 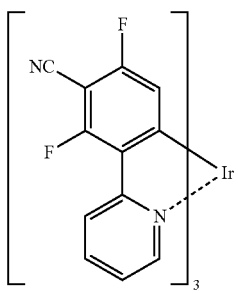
PD17 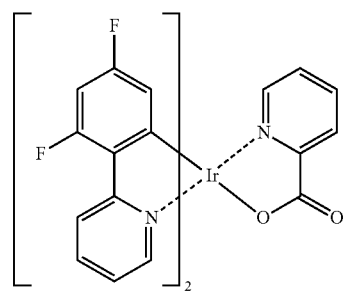
PD18 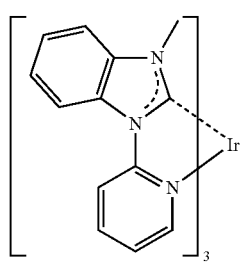
PD19 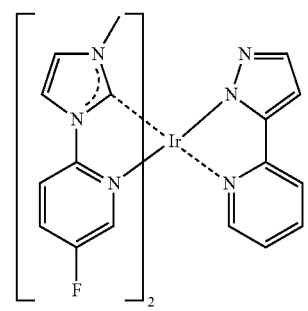
PD20 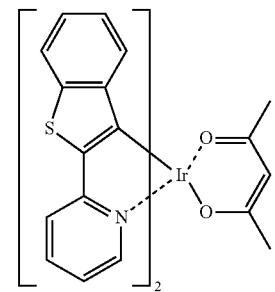
PD21 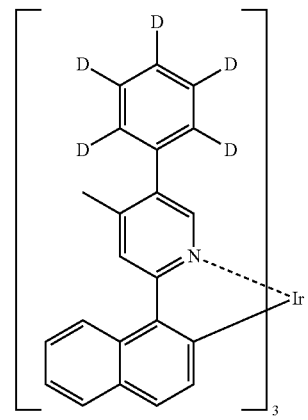

PD22
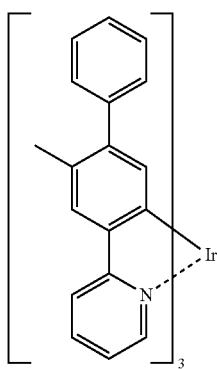
PD23
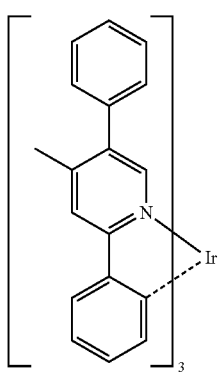
PD24
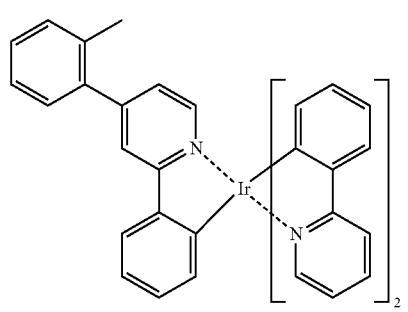
PD25
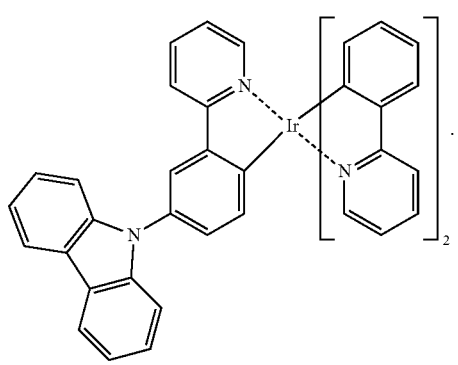
Fluorescent Dopant in Emission Layer
In some embodiments, the fluorescent dopant may be selected from Compounds FD1 to FD22:
FD1
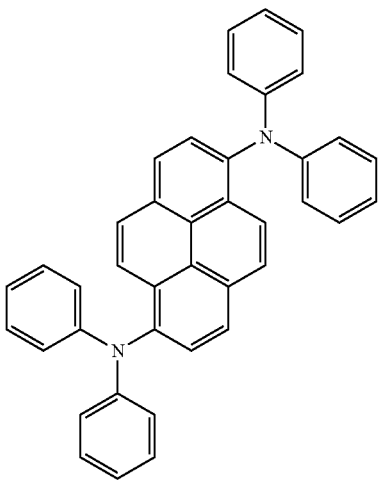
FD2
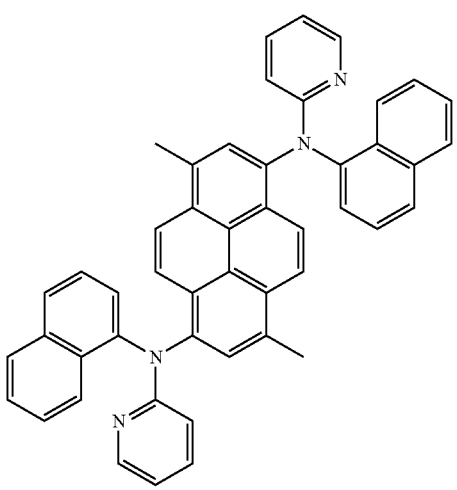
FD3
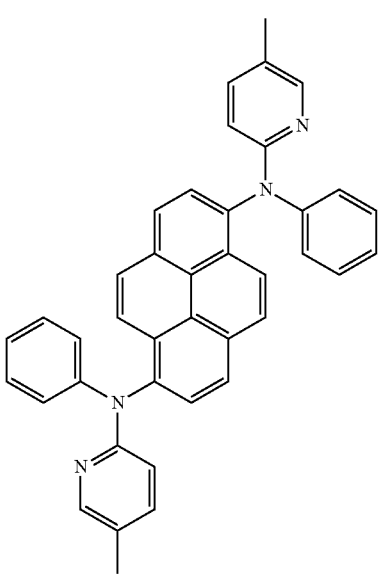

FD4
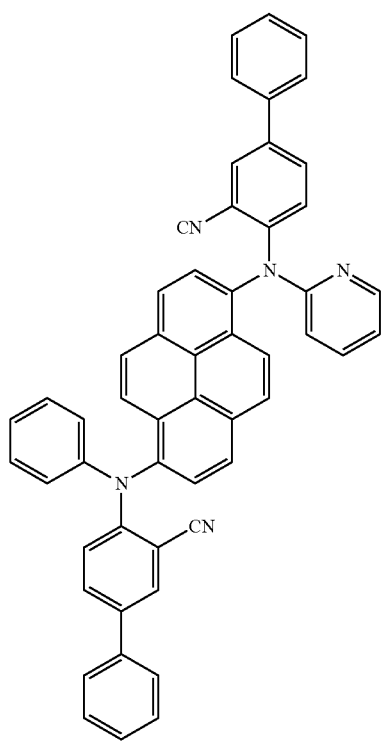
FD5
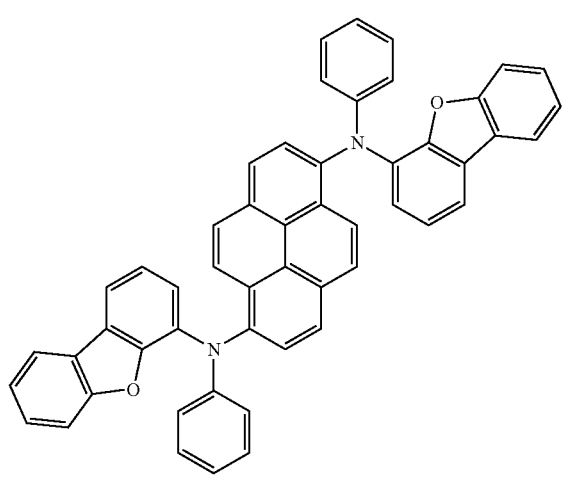
FD6
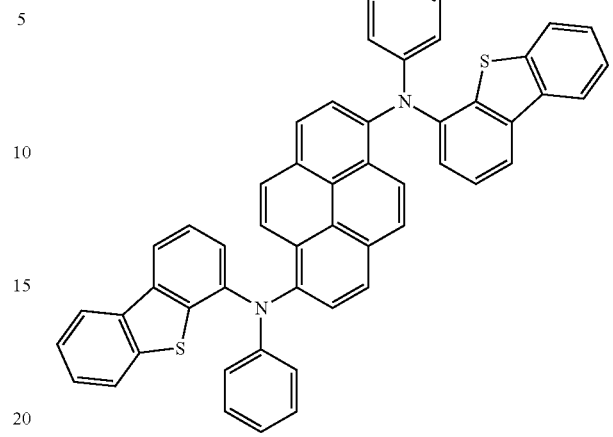
FD7
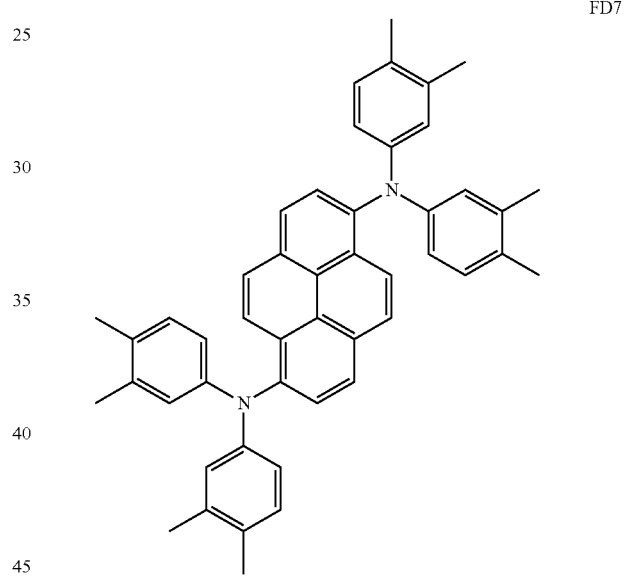
FD8
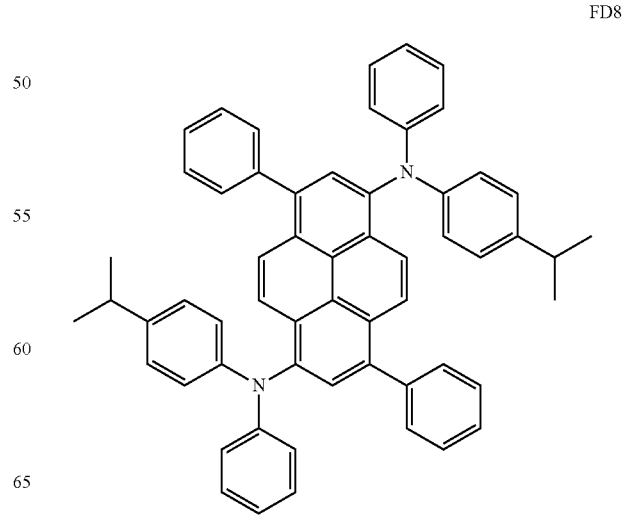

FD9
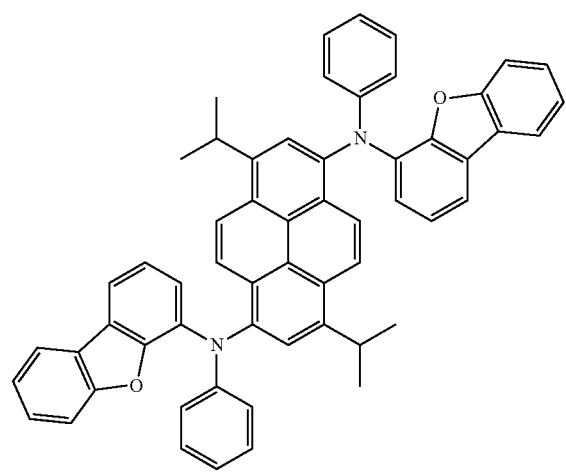
FD10
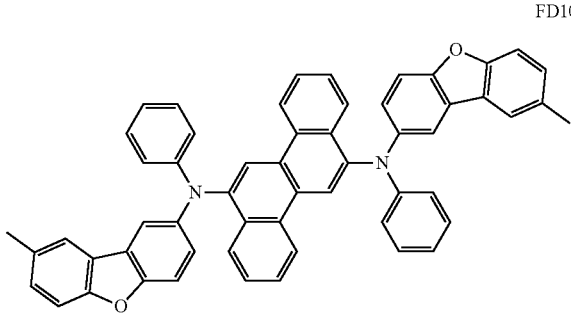
FD11
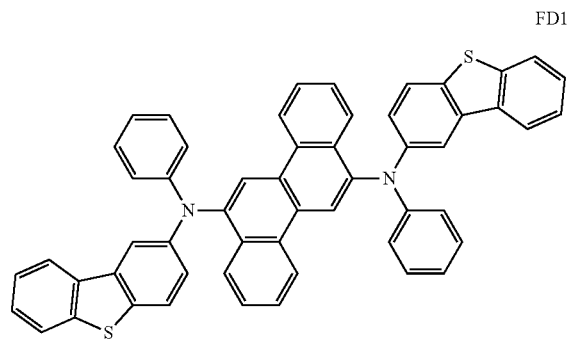
FD12
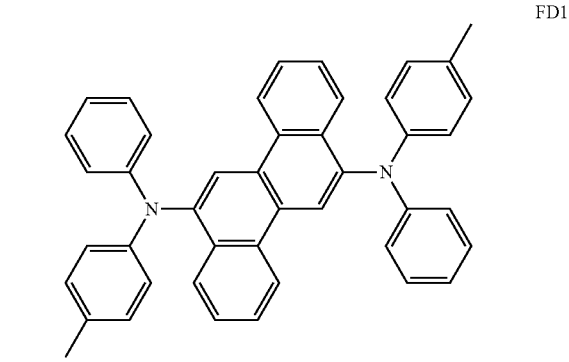
FD13
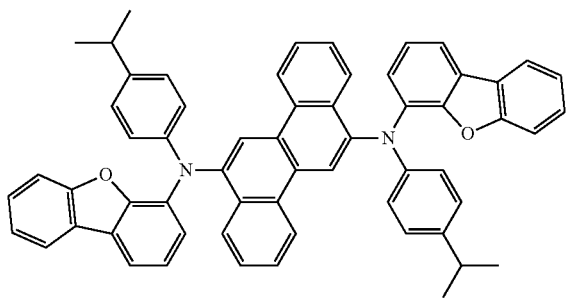
FD14
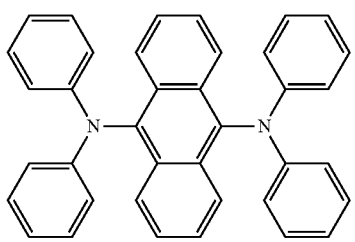
FD15
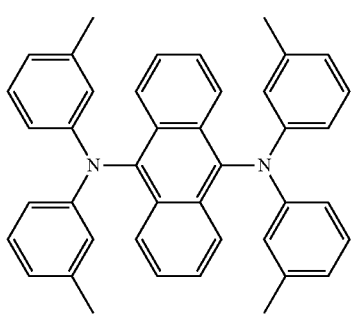
FD16
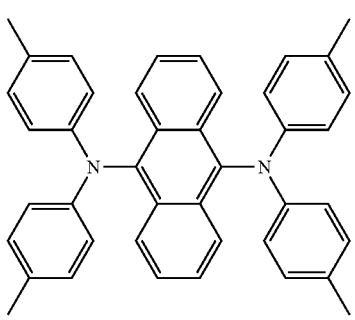

FD17
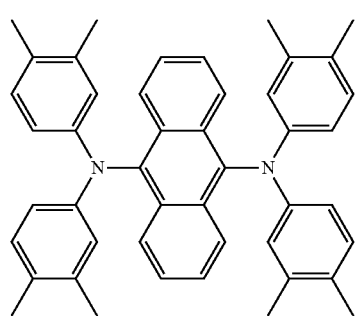
FD18
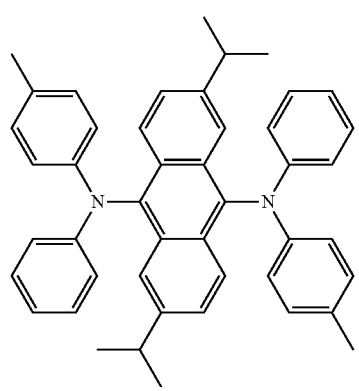
FD19
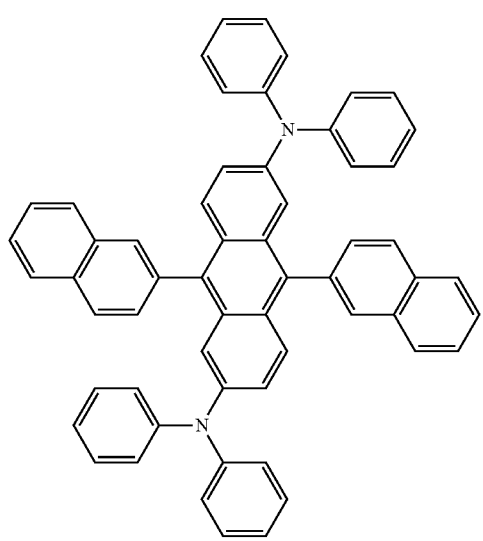
FD20
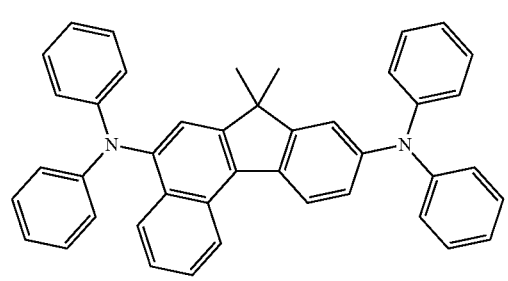
FD21
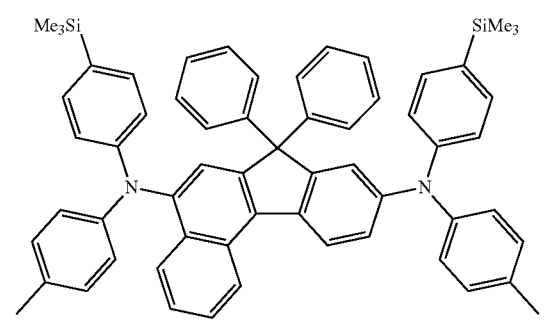
FD22
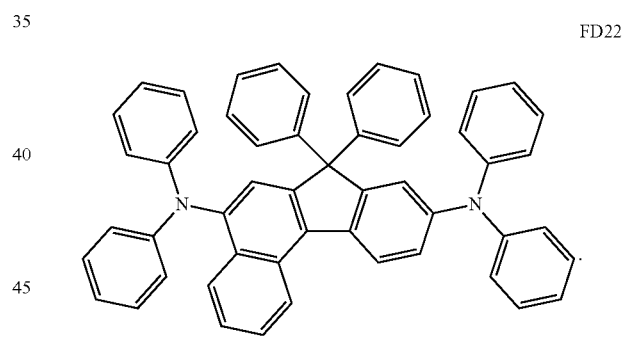
In some embodiments, the fluorescent dopant may be selected from the following compounds, but embodiments of the present disclosure are not limited thereto:
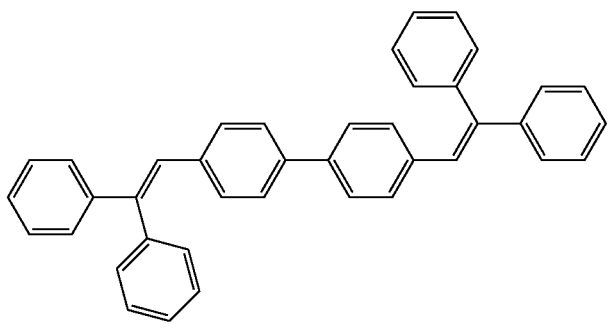
DPVBi

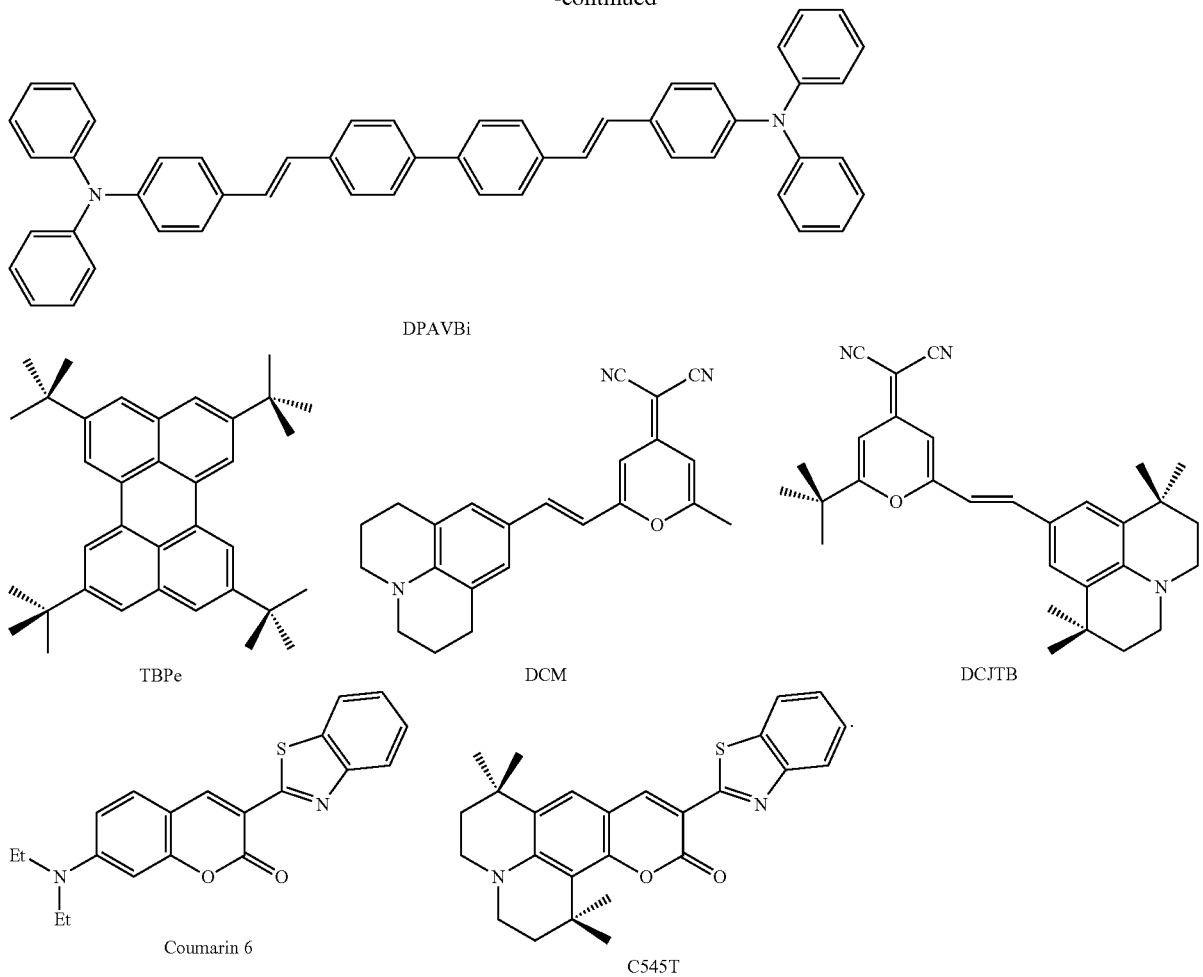

Electron Transport Region in Organic Layer

The electron transport region may have: i) a single-layer structure having a single layer including a single material, ii) a single-layer structure having a single layer including a plurality of different materials, or iii) a multi-layer structure having a plurality of layers including a plurality of different materials.

For example, the electron transport region may include at least one layer selected from a buffer layer, a hole blocking layer (HBL), an electron control layer, an electron transport layer (ETL), and an electron injection layer (EIL). However, embodiments of the present disclosure are not limited thereto.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein layers of each structure are sequentially stacked on the emission layer in each stated order, but embodiments of the present disclosure are not limited thereto.

The electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

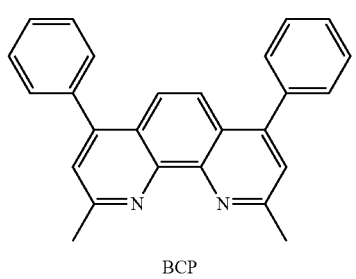

BCP

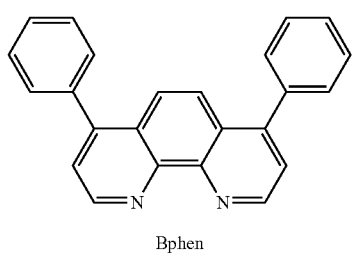

Bphen

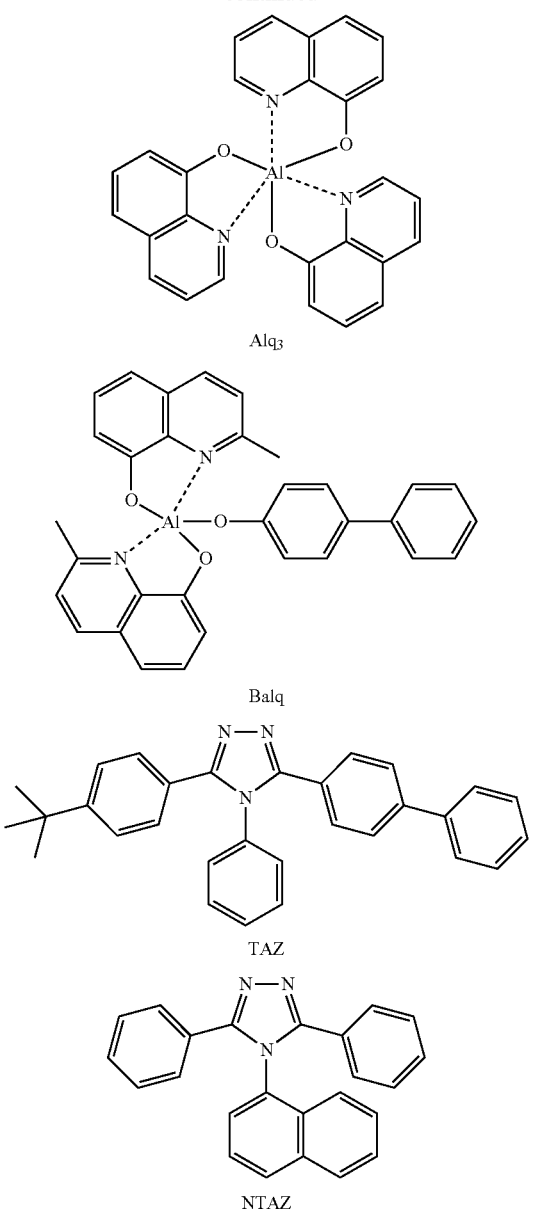

The electron transport region (for example, the electron transport layer of the electron transport region) may further include a metal-containing material, in addition to the above-described materials.

For example, the metal-containing material may include a lithium (Li) complex. Non-limiting examples of the Li complex may include compound ET-D1 (lithium quinolate (LiQ)) and/or compound ET-D2:

The electron transport region may include an electron injection layer to facilitate injection of electrons from the second electrode. The electron injection layer may directly contact the second electrode.

For example, the electron injection layer may have: i) a single-layer structure having a single layer including a single material, ii) a single-layer structure having a single layer including a plurality of different materials, or iii) a multi-layer structure having a plurality of layers including a plurality of different materials.

The electron injection layer may include a reducing dopant. The reducing dopant may include at least one selected from an alkali metal, an alkaline earth metal, a rare earth metal, an alkali metal compound, an alkaline earth metal compound, a rare earth metal compound, an alkali metal complex, an alkaline earth metal complex, and a rare earth metal complex.

The alkali metal may be selected from sodium (Na), potassium (K), rubidium (Rb), and cesium (Cs). In some embodiments, the alkali metal may be selected from K, Rb, and Cs. In some embodiments, the alkali metal may be selected from Rb and Cs. However, embodiments of the present disclosure are not limited thereto.

The alkaline earth metal may be selected from calcium (Ca), strontium (Sr), and barium (Ba).

The rare earth metal may be selected from scandium (Sc), yttrium (Y), cerium (Ce), ytterbium (Yb), gadolinium (Gd), and terbium (Tb).

Second Electrode

In the organic light-emitting device 20, the second electrode may be on the organic layer as described above. The second electrode may be a cathode serving as an electron injection electrode. For example, a material for the second electrode may be a material having a low work function, for example, a metal, an alloy, an electrically conductive compound, and/or a combination thereof.

The second electrode may include at least one selected from lithium (Li), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode may be a transmissive electrode, a semi-transmissive electrode, or a reflective electrode.

For example, the second electrode may have a single-layer structure having a single layer, or a multi-layer structure having a plurality of layers. Although embodiments of the organic light-emitting device 20 in FIG. 1 are described above, embodiments of the present disclosure are not limited thereto.

Each of the layers in the hole transport region, the emission layer, and the layers in the electron transport region may be formed in a region (e.g. a set or specific region) using any suitable method available in the art including vacuum deposition, spin coating, casting, Langmuir-Blodgett (LB) deposition, inkjet printing, laser printing, and/or laser-induced thermal imaging (LITI).

When the layers in the hole transport region, the emission layer, and the layers in the electron transport region are formed using vacuum deposition, the vacuum deposition conditions may include, for example, a deposition temperature of about 100° C. to about 500° C., a pressure of about $10^{-8}$ to about $10^{-3}$ torr, and a deposition rate of about 0.01 to about 100 Å/sec. The vacuum deposition conditions may be appropriately or suitably selected depending on the material for forming a target layer and the structure of the target layer.

When the layers in the hole transport region, the emission layer, and the layers in the electron transport region are formed using spin coating, the spin coating conditions may include, for example, a coating rate of about 2,000 rpm to about 5,000 rpm and a thermal treatment temperature of about 80° C. to 200° C. These spin coating conditions may be appropriately or suitably selected depending on the material for forming a target layer and the structure of the target layer.

General Definition of Substituents

As used herein, the term "$C_1$-$C_{60}$ alkyl group" refers to a linear or branched aliphatic hydrocarbon monovalent group having 1 to 60 carbon atoms. Non-limiting examples of the $C_1$-$C_{60}$ alkyl group may include a methyl group, an ethyl group, a propyl group, an isobutyl group, a sec-butyl group, a tent-butyl group, a pentyl group, an iso-amyl group, and a hexyl group. As used herein, the term "$C_1$-$C_{60}$ alkylene group" refers to a divalent group having substantially the same structure as the $C_1$-$C_{60}$ alkyl group.

As used herein, the term "$C_2$-$C_{60}$ alkenyl group" refers to a hydrocarbon group including at least one carbon-carbon double bond in the body (e.g., middle) or terminus of the $C_2$-$C_{60}$ alkyl group. Non-limiting examples of the $C_2$-$C_{60}$ alkenyl group may include an ethenyl group, a propenyl group, and a butenyl group. As used herein, the term "$C_2$-$C_{60}$ alkylene group" refers to a divalent group having substantially the same structure as the $C_2$-$C_{60}$ alkenyl group.

As used herein, the term "$C_2$-$C_{60}$ alkynyl group" refers to a hydrocarbon group including at least one carbon-carbon triple bond in the body (e.g., middle) or terminus of the $C_2$-$C_{60}$ alkyl group. Non-limiting examples of the $C_2$-$C_{60}$ alkynyl group may include an ethynyl group and a propynyl group.

As used herein, the term "$C_1$-$C_{60}$ alkoxy group" refers to a monovalent group represented by —O-$A_{101}$ (where $A_{101}$ is a $C_1$-$C_{60}$ alkyl group, as described above). Non-limiting examples of the $C_1$-$C_{60}$ alkoxy group may include a methoxy group, an ethoxy group, and an isopropyloxy group.

As used herein, the term "$C_3$-$C_{10}$ cycloalkyl group" refers to a monovalent, monocyclic saturated hydrocarbon group having 3 to 10 carbon atoms. Non-limiting examples of the $C_3$-$C_{10}$ cycloalkyl group may include a cyclopropyl group, a cyclobutyl group, a cyclopentyl group, a cyclohexyl group, and a cycloheptyl group. As used herein, the term "$C_3$-$C_{10}$ cycloalkylene group" refers to a divalent group having substantially the same structure as the $C_3$-$C_{10}$ cycloalkyl group.

As used herein, the term "$C_1$-$C_{10}$ heterocycloalkyl group" refers to a monovalent monocyclic group having 1 to 10 carbon atoms in which at least one hetero atom selected from nitrogen (N), oxygen (O), silicon (Si), phosphorus (P), and sulfur (S) is included as a ring-forming atom. Non-limiting examples of the $C_1$-$C_{10}$ heterocycloalkyl group may include a 1,2,3,4-oxatriazolidinyl group, a tetrahydrofuranyl group, and a tetrahydrothiophenyl group.

As used herein, the term "$C_3$-$C_{10}$ cycloalkenyl group" refers to a monovalent monocyclic group having 3 to 10 carbon atoms that includes at least one double bond in the ring but does not have aromaticity (e.g., is non-aromatic). Non-limiting examples of the $C_3$-$C_{10}$ cycloalkenyl group may include a cyclopentenyl group, a cyclohexenyl group, and a cycloheptenyl group. As used herein, the term "$C_3$-$C_{10}$ cycloalkenylene group" refers to a divalent group having substantially the same structure as the $C_3$-$C_{10}$ cycloalkenyl group.

As used herein, the term "$C_1$-$C_{10}$ heterocycloalkenyl group" refers to a monovalent monocyclic group having 1 to 10 carbon atoms that includes at least one double bond in the ring and in which at least one hetero atom selected from N, O, Si, P, and S is included as a ring-forming atom. Non-limiting examples of the $C_1$-$C_{10}$ heterocycloalkenyl group may include a 4,5-dihydro -1,2,3,4-oxatriazole group, a 2,3-dihydrofuranyl group, and a 2,3-dihydrothiophenyl group.

As used herein, the term "$C_6$-$C_{60}$ aryl group" refers to a monovalent, aromatic carbocyclic group having 6 to 60 carbon atoms, and the term "$C_6$-$C_{60}$ arylene group" refers to a divalent, aromatic carbocyclic group having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include at least two rings, the rings may be fused (e.g., condensed) to each other.

As used herein, the term "$C_1$-$C_{60}$ heteroaryl group" refers to a monovalent, aromatic heterocarbocyclic group having 1 to 60 carbon atoms in which at least one hetero atom selected from N, O, Si, P, and S is included as a ring-forming atom. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group includes at least two rings, the rings may be fused (e.g., condensed) to each other.

As used herein, * and *' indicate, unless defined otherwise, a binding site to an adjacent atom in a corresponding formula.

Embodiments of the present disclosure will now be described in more detail with reference to the following examples. However, these examples are provided only for illustrative purposes and are not intended to limit the scope of embodiments of the present disclosure.

EXAMPLES

Example 1

Set (e.g., calculated or predetermined) amounts of compounds as represented in Table 1 were mixed together to prepare an organic film forming composition.

TABLE 1

| Name of compound | Amount |
| --- | --- |
| sodium methacrylate | 1 part by weight |
| dodecanediol dimethacrylate (DDMA) | 100 parts by weight |
| diphenyl (2,4,6-trimethylbenzoyl)-phosphine oxide (TPO) | 3 parts by weight |

The organic film forming composition was deposited on a glass substrate by spin coating using a spin coater ACE200

(available from DONG AH TRADE CO., Korea) at about 25° C. at about 2,000 rpm for about 30 seconds. The resulting glass substrate was then moved into a chamber under a nitrogen atmosphere and then cured by exposure to a UV lamp at a wavelength of about 390 nm and an energy of about 1 J/cm$^2$ to thereby form an organic film.

Example 2

An organic film was formed in substantially the same manner as in Example 1, except that set (e.g., calculated or predetermined) amounts of compounds as represented in Table 2 were mixed together to prepare an organic film forming composition.

TABLE 2

| Name of compound | Amount |
| --- | --- |
| sodium methacrylate | 3 parts by weight |
| hydroxyethyl methacrylate (HEMA) | 20 parts by weight |
| dodecanediol dimethacrylate (DDMA) | 100 parts by weight |
| diphenyl (2,4,6-trimethylbenzoyl)-phosphine oxide (TPO) | 4 parts by weight |

Comparative Example 1

An organic film was formed in substantially the same manner as in Example 1, except that set (e.g., calculated or predetermined) amounts of compounds as represented in Table 3 were mixed together to prepare an organic film forming composition.

TABLE 3

| Name of compound | Amount |
| --- | --- |
| dodecanediol dimethacrylate (DDMA) | 100 parts by weight |
| diphenyl (2,4,6-trimethylbenzoyl)-phosphine oxide (TPO) | 3 parts by weight |

Comparative Example 4

An organic film was formed in substantially the same manner as in Example 1, except that set (e.g., calculated or predetermined) amounts of compounds as represented in Table 4 were mixed together to prepare an organic film forming composition.

TABLE 4

| Name of compound | Amount |
| --- | --- |
| hydroxyethyl methacrylate (HEMA) | 20 parts by weight |
| dodecanediol dimethacrylate (DDMA) | 100 parts by weight |
| diphenyl (2,4,6-trimethylbenzoyl)-phosphine oxide (TPO) | 4 parts by weight |

Evaluation Example 1: Hygroscopic Property Evaluation of Organic Film by Fourier Transform-infrared (FT-IR) Spectroscopy The hygroscopic properties (e.g., moisture-adsorbing abilities) of each of the organic films of Example 1 and Comparative Example 1 were evaluated before and after storage in a thermo-hygrostat (TH-340, available from ITC, at 85° C. and 85% relative humidity (RH) for 36 hours) using a Fourier transform-infrared (FT-IR) spectroscope (IFS series, available from Bruker, Golden gate ATR mode, 64 scans). The results are shown in FIG. 2.

Figure 2:
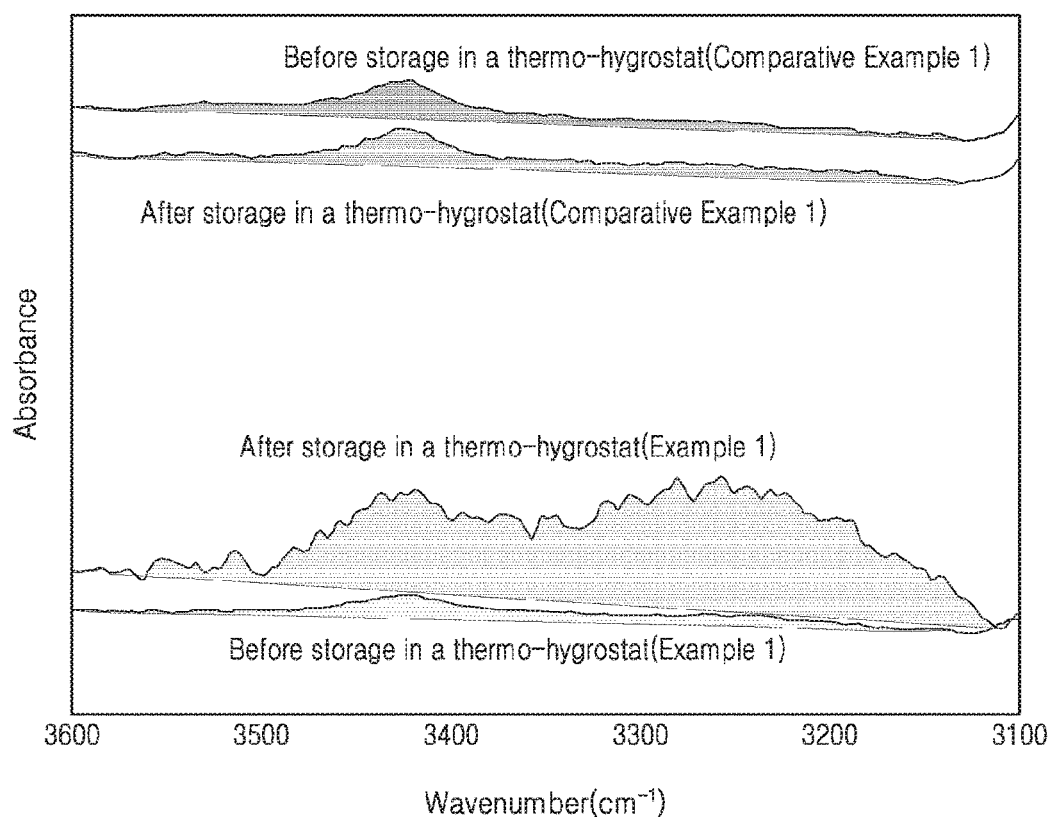
FIG. 2 is a graph illustrating the results of hygroscopic property evaluations of the organic films of Example 1 and Comparative Example 1 by Fourier transform-infrared (FT-IR) spectroscopy.

Referring to FIG. 2, nearly no change occurred in the —OH peak before and after storage in the thermo-hygrostat in the organic film of Comparative Example 1, while growth of the —OH peak (between 3000~3500 cm$^{-1}$) occurred in the organic film of Example 1 after storage in the thermo-hygrostat, indicating that moisture (e.g., H$_2$O) adsorption occurred in the organic film of Example 1. Therefore, an organic film formed of (e.g., including) an organic film forming composition including sodium methacrylate may have higher hygroscopic properties (e.g., moisture-adsorbing abilities) compared to an organic film including no sodium methacrylate.

Evaluation Example 2: Hygroscopic Property Evaluation of Organic Film by Thermogravimetric Analysis (TGA)

The hygroscopic properties (e.g., moisture-adsorbing abilities) of the organic films of Comparative Examples 1 and 2 and Example 2 were evaluated after storage in a thermo-hygrostat (TH-340, available from ITC, at 85° C. and 85% relative humidity (RH)) for 36 hours by thermo-gravimetry (using a thermogravimetric analyzer, Universal V4.5A, available from TA Instruments), in which weight changes were observed while increasing the temperature from about 30° C. to about 300° C. at a rate of about 20° C./min. The results are shown in FIGS. 3A, 3B, and 3C, respectively.

Figure 3A:
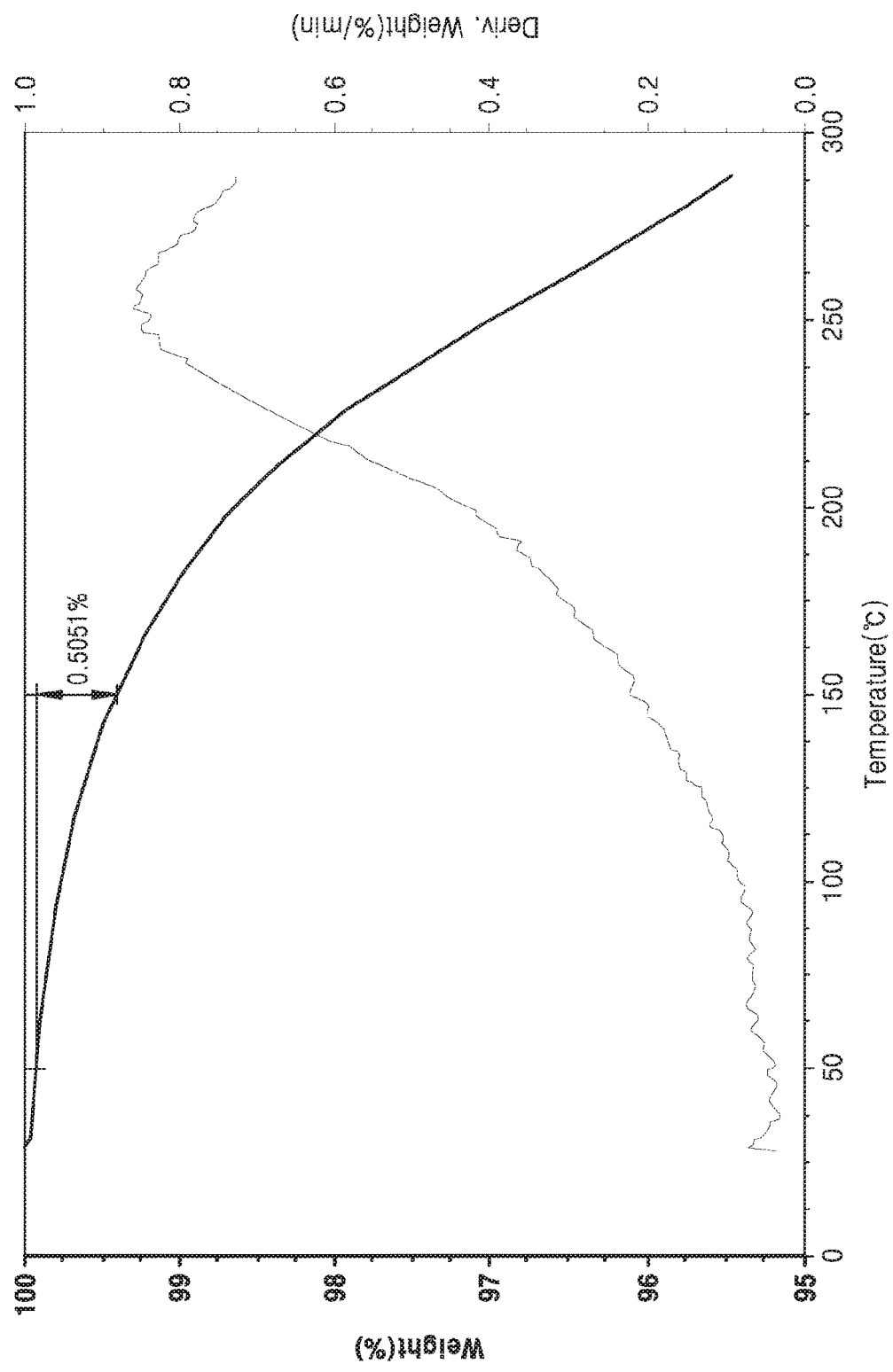
FIGS. 3A to 3C are graphs illustrating the results of hygroscopic property evaluations of the organic films of Comparative Example 1, Comparative Example 2, and Example 2, respectively, by thermogravimetric analysis (TGA).
Figure 3B:
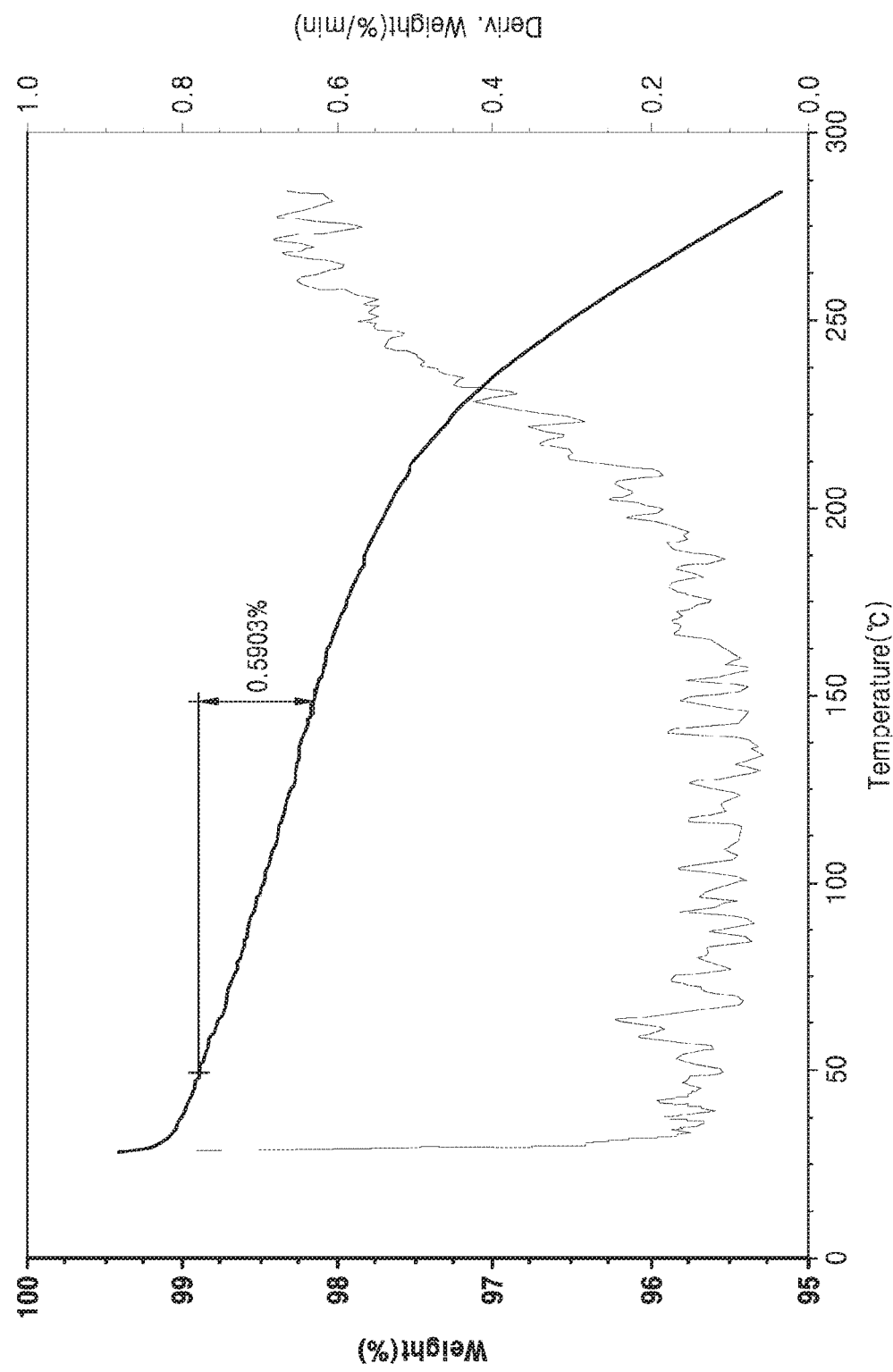
Figure 3C:
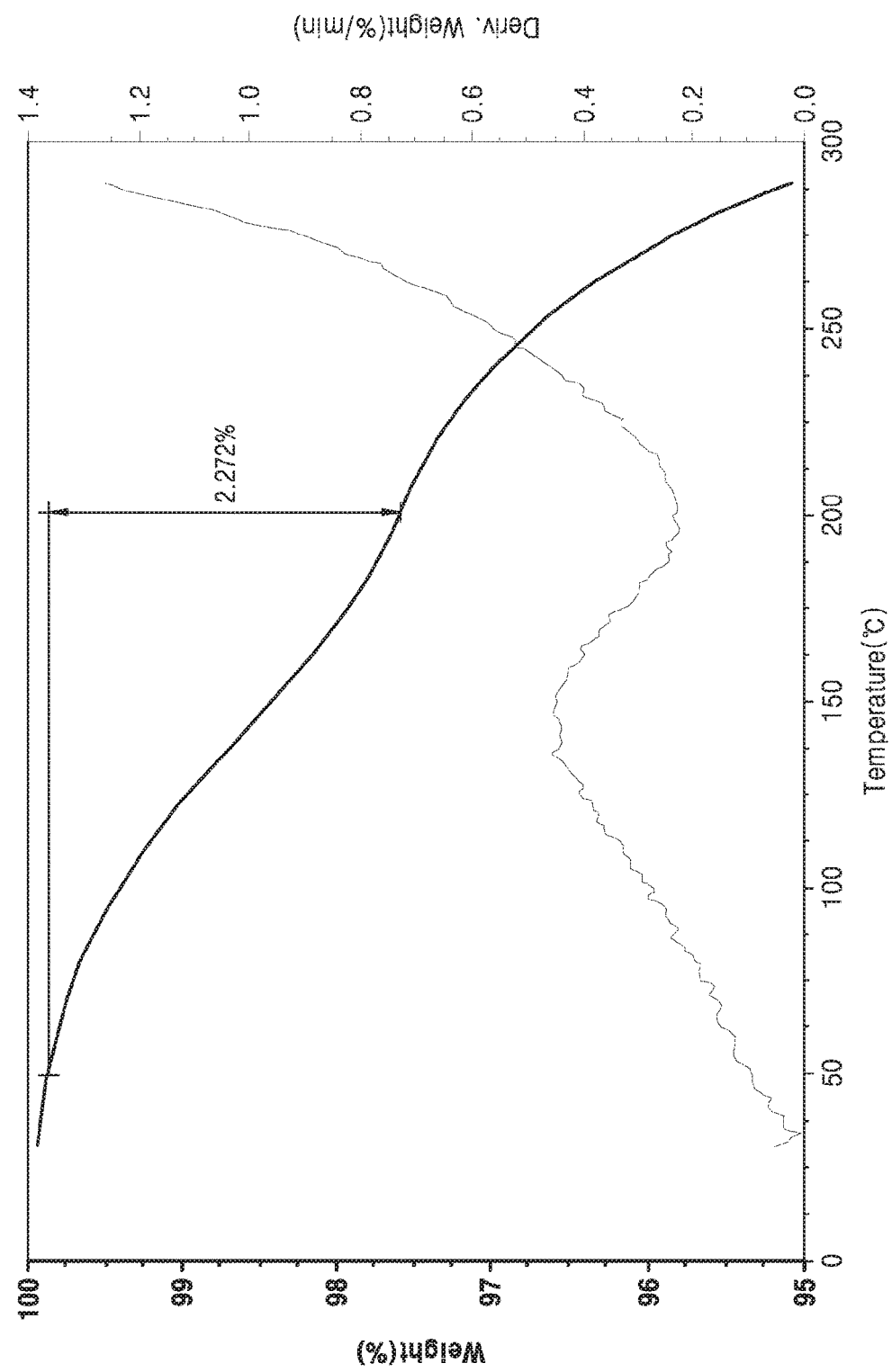

Referring to FIGS. 3A and 3B, the organic films of Comparative Examples 1 and 2 were found to have weight losses of about 0.5051 wt % and 0.5903 wt %, respectively, while the organic film of Example 2 had a weight loss of about 2.2 wt %. These weight losses are attributed to desorption of moisture that was physically adsorbed to the organic films (e.g., during storage in the thermo-hygrostat). Thus, the organic film of Example 2 was found to have higher hygroscopic properties (e.g., moisture-adsorbing abilities) than the organic films of Comparative Examples 1 and 2.

As described above, according to one or more embodiments, when an electronic apparatus includes a cured product of an organic film forming composition including a metal (meth)acrylate of Formula 1 and a curable material as described above, the electronic apparatus may be protected from moisture permeation for a long time.

It should be understood that the example embodiments described herein should be considered in a descriptive sense only and not for purposes of limitation. Descriptions of features or aspects within each example embodiment should typically be considered as being available for other similar features or aspects in other example embodiments.

The use of "may" when describing embodiments of the present disclosure refers to "one or more embodiments of the present disclosure". In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more example embodiments have been described with reference to the drawings, it will be understood by those of ordinary skill in the art that various changes in form and details may be made therein without departing from the spirit and scope as defined by the following claims and equivalents thereof.

What is claimed is:
1. An organic film forming composition comprising:
a metal (meth)acrylate represented by Formula 1; and
a curable material,

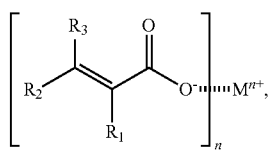

Formula 1 wherein, in Formula 1,
M is a metal atom;
n is an integer selected from 1 to 3;
$R_1$ to $R_3$ are each independently selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group; and
▬▬▬ represents an interaction between adjacent ions,
wherein the curable material is selected from ethylene glycol di(meth)acrylate, hexanediol di(meth)acrylate, heptanediol di(meth)acrylate, octanediol di(meth)acrylate, nonanediol di(meth)acrylate, decanediol di(meth)acrylate, dodecanediol di(meth)acrylate, triethylpropane tri(meth)acrylate, pentaerythritol tri(meth)acrylate, pentaerythritol tetra(meth)acrylate, dipentaerythritol tri(meth)acrylate, dipentaerythritol tetra(meth)acrylate, and combinations thereof, and the amount of the metal (meth)acrylate is about 0.1 to 10 parts by weight based on 100 parts by weight of the curable material.

2. The organic film forming composition of claim 1, wherein, in Formula 1, M is selected from lithium (Li), sodium (Na), calcium (Ca), zinc (Zn), magnesium (Mg), and aluminum (Al).

3. The organic film forming composition of claim 1, wherein the metal (meth)acrylate is represented by at least one selected from Formulae 1A to 1C:

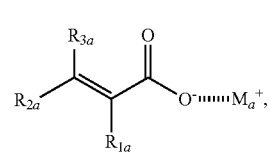

Formula 1A

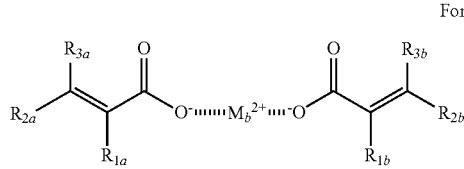

Formula 1B

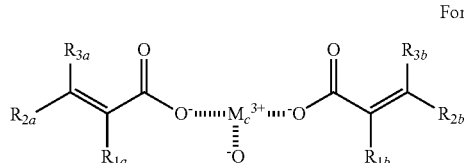

Formula 1C

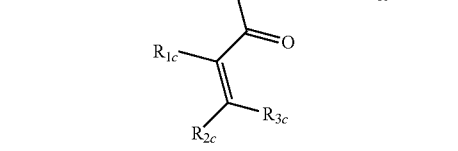

wherein, in Formulae 1A to 1C,
$M_a$ is a monovalent metal, $M_b$ is a divalent metal, and $M_c$ is a trivalent metal; and
$R_{1a}$ to $R_{1c}$ are each independently the same as described above in connection with $R_1$, $R_{2a}$ to $R_{2c}$ are each independently the same as described above in connection with $R_2$, and $R_{3a}$ to $R_{3c}$ are each independently the same as described above in connection with $R_3$.

4. The organic film forming composition of claim 1, wherein, in Formula 1, $R_1$ to $R_3$ are each independently selected from the group consisting of:
hydrogen, deuterium, —F, —Cl, —Br, —I, a hydroxyl group, a cyano group, a nitro group, an amino group, an amidino group, a hydrazino group, and a hydrazono group;
a $C_1$-$C_{10}$ alkyl group; and
a $C_1$-$C_{10}$ alkyl group substituted with at least one selected from deuterium, —F, —Cl, —Br, —I, a hydroxyl group, a cyano group, a nitro group, an amino group, an amidino group, a hydrazino group, and a hydrazono group.

5. The organic film forming composition of claim 1, wherein, in Formula 1,
$R_1$ is a $C_1$-$C_{10}$ alkyl group, and $R_2$ and $R_3$ are both hydrogens; or
$R_1$ to $R_3$ are all hydrogens.

6. The organic film forming composition of claim 1, wherein the metal (meth)acrylate is selected from sodium (meth)acrylate, lithium (meth)acrylate, calcium (meth)acrylate, magnesium (meth)acrylate, aluminum (meth)acrylate, and combinations thereof.

7. The organic film forming composition of claim 1, wherein the organic film forming composition further comprises an initiator.

8. An electronic apparatus comprising:
a substrate;
an electronic device on the substrate; and
a sealing layer covering the electronic device and comprising a number "q" of sealing units, each sealing unit comprising an organic film and an inorganic film that are sequentially stacked on the electronic device, wherein q is an integer of 1 or greater, and the organic film comprises a cured product of the organic film forming composition of claim 1.

9. The electronic apparatus of claim 8, wherein the electronic device is selected from an organic light-emitting device (OLED), a liquid crystal display (LCD), a light-emitting diode (LED), an organic photovoltaic (OPV) cell, and an organic thin film transistor.

10. The electronic apparatus of claim 8, wherein the cured product is a polymer comprising: i) a repeating unit originating from the curable material, and ii) at least one moiety originating from the metal (meth)acrylate represented by Formula 1; and
the moiety originating from the metal (meth)acrylate represented by Formula 1 is selected from: a) a repeating unit represented by Formula 10, and b) a terminal group represented by Formula 11:

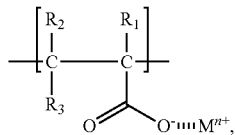

Formula 10

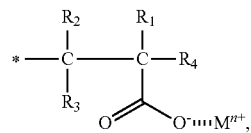

Formula 11 wherein, in Formulae 10 and 11,

M, n, and $R_1$ to $R_3$ are each independently the same as described above in connection with Formula 1;

$R_4$ is the same as described above in connection with $R_2$; and

* is a binding site to a repeating unit originating from the curable material.

11. The electronic apparatus of claim 10, wherein a water molecule that has penetrated into the sealing unit is adsorbed to a carboxylate group ($COO^-$) in Formulae 10 and/or 11 via a hydrogen bond or is adsorbed to a metal ion ($M^{n+}$) in Formulae 10 and/or 11 via an ion-dipole interaction.

12. The electronic apparatus of claim 8, wherein the inorganic film comprises a metal, a metal nitride, a metal oxide, a metal oxynitride, or a combination thereof.

13. The electronic apparatus of claim 8, wherein the sealing layer further comprises a lower inorganic film between the electronic device and the organic film.

14. The electronic apparatus of claim 8, wherein the electronic apparatus further comprises at least one selected from a capping layer and a protective layer between the electronic device and the sealing unit.

* * * * *